United States Patent
Oohara et al.

(10) Patent No.: US 7,532,404 B2
(45) Date of Patent: May 12, 2009

(54) OPTICAL DEVICE HAVING MICRO LENS ARRAY

(75) Inventors: Junji Oohara, Nisshin (JP); Kazuhiko Kano, Toyoake (JP); Yoshitaka Noda, Bisai (JP); Yukihiko Takeuchi, Nishikamo-gun (JP); Toshiyuki Morishita, Nagoya (JP)

(73) Assignee: DENSO CORPORATION, Kariya (JP)

( * ) Notice: Subject to any disclaimer, the term of this patent is extended or adjusted under 35 U.S.C. 154(b) by 411 days.

(21) Appl. No.: 11/528,611

(22) Filed: Sep. 28, 2006

(65) Prior Publication Data

US 2007/0019406 A1 Jan. 25, 2007

Related U.S. Application Data

(62) Division of application No. 10/759,025, filed on Jan. 20, 2004, now Pat. No. 7,129,176.

(30) Foreign Application Priority Data

Mar. 6, 2003 (JP) ................. 2003-60548

(51) Int. Cl.
G02B 27/10 (2006.01)
G02B 6/32 (2006.01)
(52) U.S. Cl. ......................... 359/620; 385/33
(58) Field of Classification Search ............ 65/406, 65/408, 409; 257/98, E21.023; 264/1.32, 264/1.34, 1.36, 2.6; 359/619, 620, 626; 385/33, 385/34, 39, 120, 129
See application file for complete search history.

(56) References Cited

U.S. PATENT DOCUMENTS

| 4,585,299 | A | 4/1986 | Strain |
|---|---|---|---|
| 5,238,877 | A | 8/1993 | Russell |
| 5,500,916 | A | 3/1996 | Cirelli et al. |
| 5,628,917 | A | 5/1997 | MacDonald et al. |
| 5,682,455 | A | 10/1997 | Kovacic et al. |
| 5,726,805 | A | 3/1998 | Kaushik et al. |
| 5,858,256 | A | 1/1999 | Minne et al. |
| 5,871,653 | A | 2/1999 | Ling |
| 6,031,951 | A | 2/2000 | Stiens |
| 6,157,429 | A | 12/2000 | Miyawaki et al. |
| 6,177,236 | B1 | 1/2001 | Apte |
| 6,733,955 | B1 | 5/2004 | Geiger et al. |
| 7,129,176 | B2 * | 10/2006 | Oohara et al. ............ 438/696 |
| 2005/0265662 | A1 * | 12/2005 | Oohara et al. ............ 385/43 |
| 2007/0059856 | A1 * | 3/2007 | Takeuchi et al. ......... 438/30 |
| 2007/0251915 | A1 * | 11/2007 | Oohara et al. ............ 216/24 |
| 2008/0130139 | A1 * | 6/2008 | Oohara et al. ............ 359/754 |

FOREIGN PATENT DOCUMENTS

| JP | A-H05-218494 | 8/1993 |
|---|---|---|
| JP | A-H06-194502 | 7/1994 |
| JP | A-H09-90104 | 4/1997 |
| JP | A-2000-299310 | 10/2000 |
| JP | A-2002-231945 | 8/2002 |
| JP | A-2003-7987 | 1/2003 |

* cited by examiner

*Primary Examiner*—David N Spector
(74) *Attorney, Agent, or Firm*—Posz Law Group, PLC

(57) ABSTRACT

An optical device includes a semiconductor substrate and an optical part having a plurality of columnar members disposed on the substrate. Each columnar member is disposed in a standing manner and adhered each other so that the optical part is provided. The optical part is integrated with the substrate. This optical part has high design freedom.

19 Claims, 24 Drawing Sheets

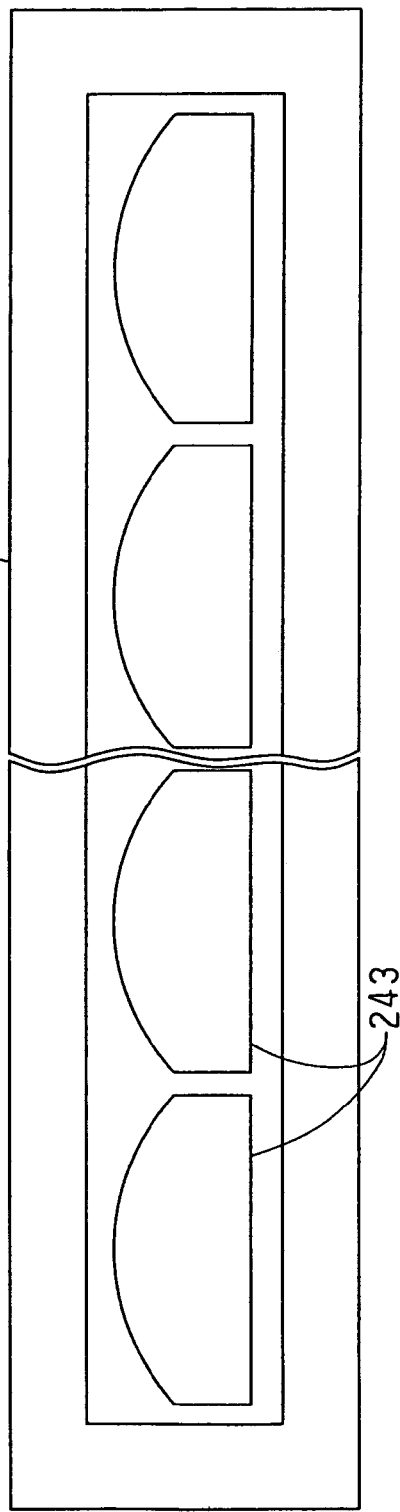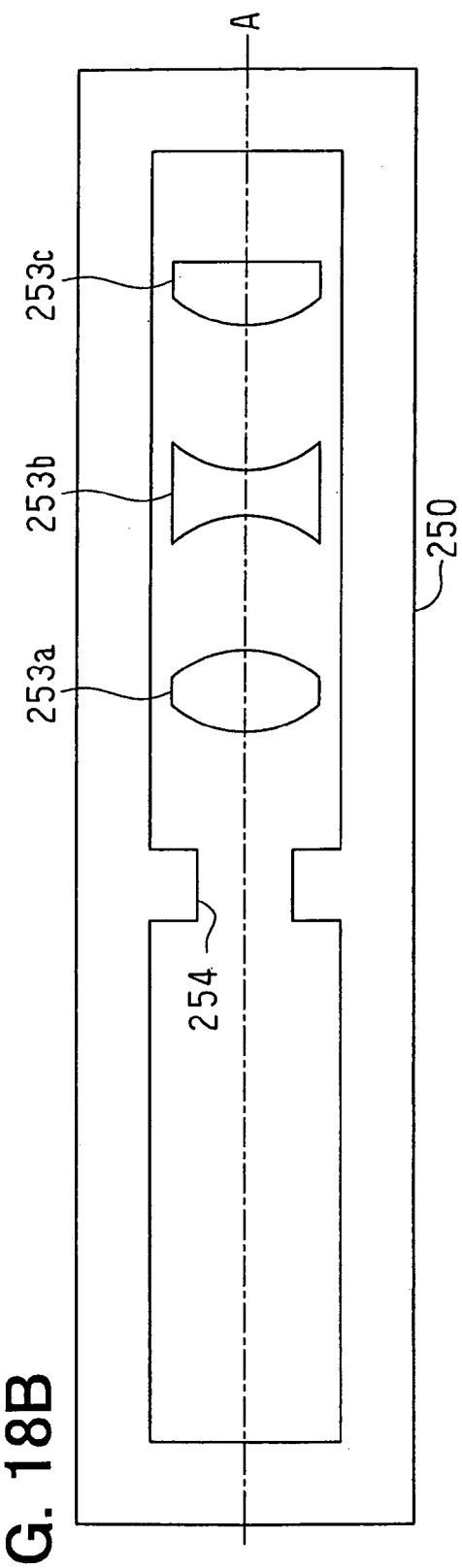

US 7,532,404 B2

OPTICAL DEVICE HAVING MICRO LENS ARRAY

CROSS REFERENCE TO RELATED APPLICATION

This application is a division of application Ser. No. 10/759,025 filed on Jan. 20, 2004 now U.S. Pat. No. 7,129, 176. This application is also based on Japanese Patent Application No. 2003-60548 filed on Mar. 6, 2003, the disclosure of which is incorporated by reference.

FIELD OF THE INVENTION

The present invention relates to an optical device having a micro lens array and a method for manufacturing the same.

BACKGROUND OF THE INVENTION

An optical device having a micro lens array is disclosed in Japanese Patent Application Publication No. H06-194502. The device is manufactured with the following method shown in FIGS. 35A to 35D.

As shown in FIG. 35A, a photo-resist 101 is applied to a glass substrate 105. Then, the resist 101 is patterned into a predetermined pattern, as shown in FIG. 35B. Next, the resist 101 is annealed so that the resist 101 becomes to have a hemispherical shape. Here, the resist 101 is fluidized when the resist 101 is annealed at a certain temperature, so that the resist 101 is deformed to have the hemispherical shape because of a surface tension of the resist 101. Then, the resist 101 is cooled down to a room temperature, so that the resist 101 is solidified with having the hemispherical shape. In this way, the resist 101 is used as a construction of a micro lens array.

Further, another optical device having a micro lens array is manufactured with the following methods. A photo-resist on a glass substrate having a hemispherical shape like the resist 101 on the substrate 105 shown in FIG. 35D is prepared. Then, the resist with the substrate is etched with an anisotropic etching method such as a highly anisotropic dry-etching method, so that the hemispherical shape of the resist is transcribed to the substrate. Thus, the glass substrate has a hemispherical shape, and is used as a construction of a micro lens array.

However, in the above methods, a curvature of a lens, i.e., a curvature of the hemispherical shape of the resist 101 or the glass substrate 105 is not controlled correctly. That is because the hemispherical shape is formed by the surface tension of the resist 101. Therefore, the hemispherical shape is formed by natural consequences, so that the micro lens array having a controlled curvature is not manufactured in the above methods. Specifically, it is difficult to manufacture a lens having a small curvature radius i.e., a large numerical aperture (i.e., a large NA) with the above methods. Further, it is difficult to manufacture a lens having aspheric shape with the above methods.

SUMMARY OF THE INVENTION

In view of the above problem, it is an object of the present invention to provide an optical device having a micro lens array. Specifically, the micro lens array of the device has high design freedom.

It is another object of the present invention to provide a method for manufacturing an optical device having a micro lens array.

An optical device includes a semiconductor substrate and an optical part having a plurality of columnar members disposed on the substrate. Each columnar member is disposed in a standing manner and adhered each other so that the optical part is provided. The optical part is integrated with the substrate.

The optical part having a predetermined shape can be formed as planned, so that the above device has high design freedom.

Preferably, the optical part includes a micro lens array. More preferably, each columnar member has a boundary disposed therebetween, and the boundary is parallel to a light axis of the optical part.

Preferably, the optical part includes an impurity doped layer, and the impurity doped layer has an impurity concentration distribution in a vertical direction of the substrate. More preferably, the impurity concentration distribution has a chevron shape so that a maximum impurity concentration is disposed in a predetermined depth, which is measured from a surface of the optical part.

Further, a method for manufacturing an optical device is provided. The method includes the steps of: etching a semiconductor substrate with a predetermined mask so that a plurality of trenches is formed in the substrate and a plurality of semiconductor wall is formed between the trenches; and thermally oxidizing the substrate so that the semiconductor wall is transformed into a semiconductor oxide wall and the trench is filled with semiconductor oxide. The semiconductor oxide wall and the semiconductor oxide in the trench provide an optical part. The optical part is integrally formed with the substrate, and passes a light therethrough. The optical part made of the above method having a predetermined shape can be formed as planned, so that the above device has high design freedom.

Preferably, the trench has a width, and the semiconductor wall has another width, and the widths of both of the trench and the semiconductor wall are determined in such a manner that the trench is filled with the semiconductor oxide and at the same time the semiconductor wall is transformed into the semiconductor oxide wall in the step of thermally oxidizing the substrate. More preferably, a ratio between the width of the trench and the width of the semiconductor wall is 0.55: 0.45.

Preferably, the method further includes the step of forming an epitaxial layer on the substrate. The epitaxial layer includes an impurity concentration distribution having a chevron shape in a film thickness direction. More preferably, the optical part includes the epitaxial layer so that the optical part condenses a light in a vertical direction, which is perpendicular to the substrate.

BRIEF DESCRIPTION OF THE DRAWINGS

The above and other objects, features and advantages of the present invention will become more apparent from the following detailed description made with reference to the accompanying drawings. In the drawings:

FIGS. 18A and 18B are plan views showing different devices according to the second embodiment;

DETAILED DESCRIPTION OF THE PREFERRED EMBODIMENTS

First Embodiment

Figure 1:
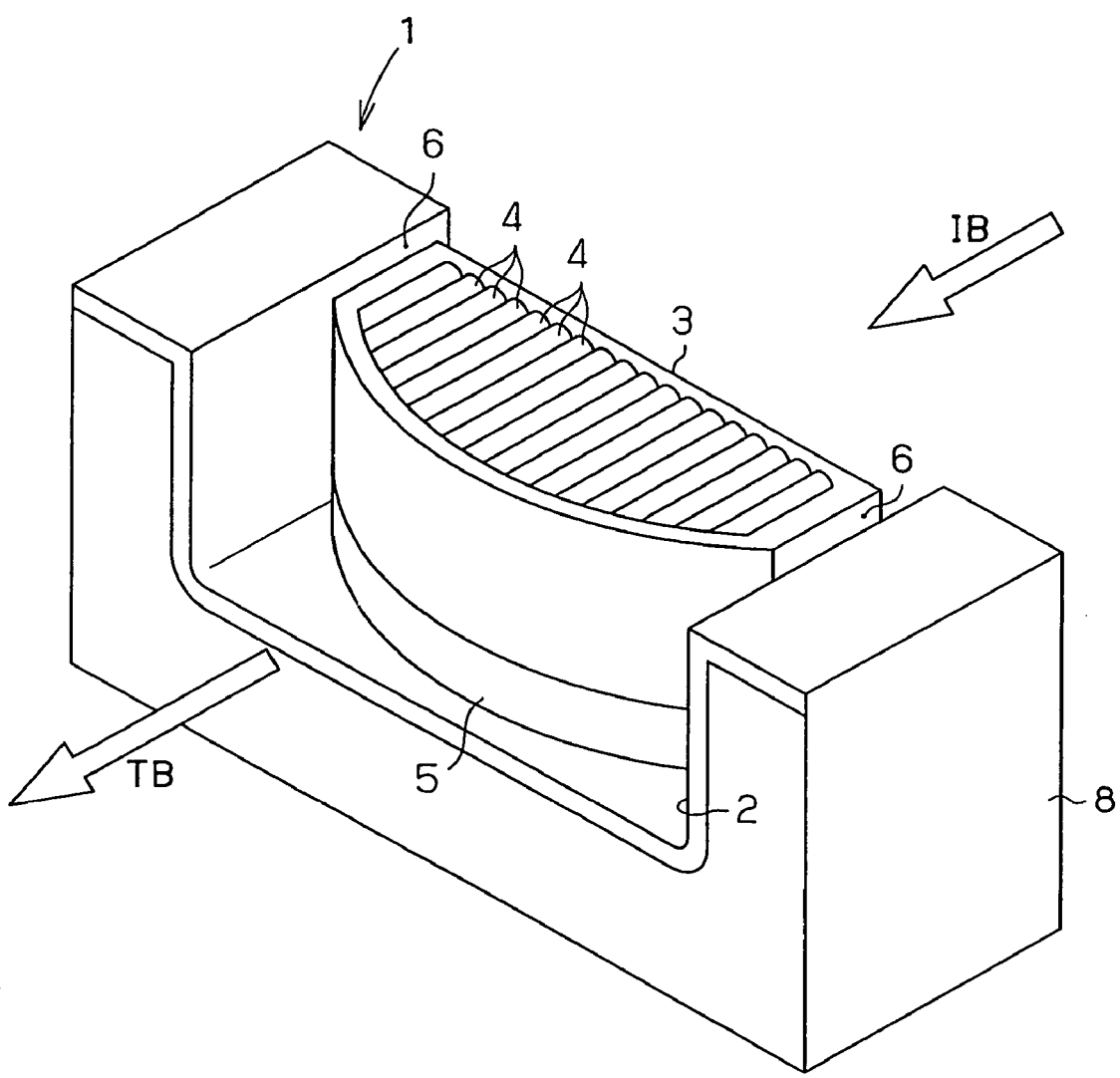
FIG. 1 is a perspective view showing an optical device according to a first embodiment of the present invention.
Figure 2A:
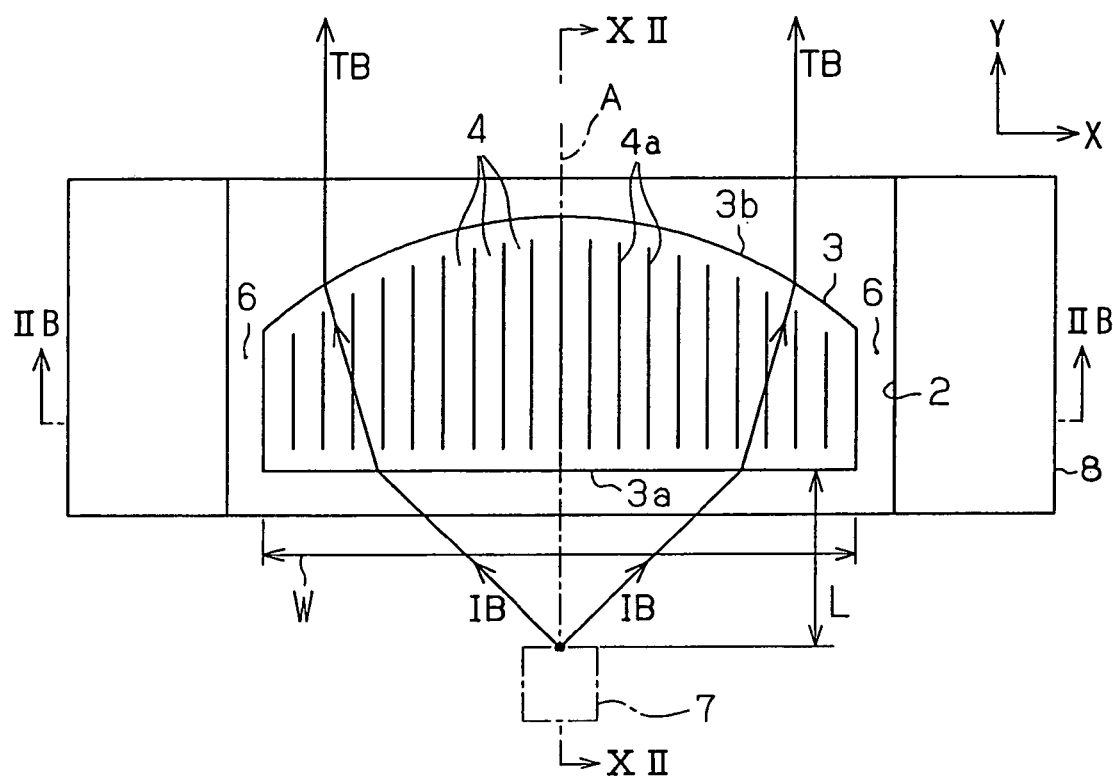
FIG. 2A is a plan view showing the device.
Figure 2B:
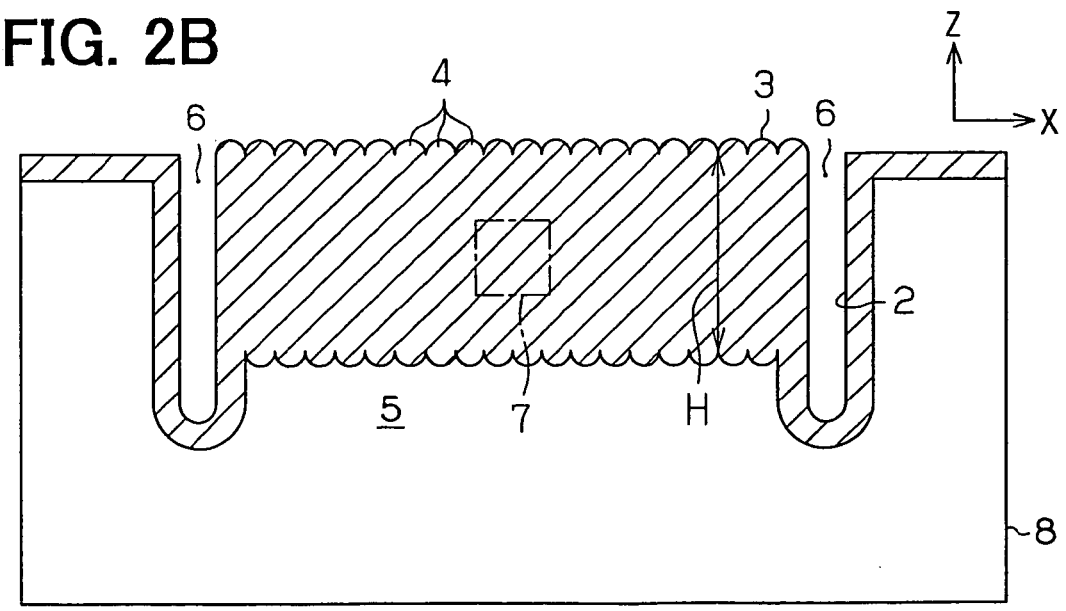
FIG. 2B is a cross-sectional view showing the device taken along line IIB-IIB in FIG. 2A, according to the first embodiment.

An optical device 1 having a micro lens array (i.e., a micro lens) according to a first embodiment of the present invention is shown in FIGS. 1-2B. The device 1 includes a silicon substrate 8 having a concavity 2. In the concavity 2, a micro lens array 3 is disposed on a bottom surface of the concavity 2. The micro lens array 3 is a flat type cylindrical convex lens (i.e., a cylindrical plano-convex lens). Specifically, the micro lens array 3 includes a flat inlet surface 3a and a convexity outlet surface 3b. The micro lens array 3 is constructed by a plurality of columnar members 4. Each columnar member 4 is made of silicon oxide, and contacts each other. The columnar member 4 is disposed perpendicularly to the foreside surface of the substrate 8, and is formed integrally with the substrate 8. A light emitted from a light source 7 such as laser device passes through the micro lens array 3. Specifically, the light passes through each columnar member 4.

As shown in FIG. 2B, the bottom side of the columnar member 4 has an arc like cross-section. Thus, the micro lens array 3, i.e., a silicon oxide block is constructed with a plurality of columnar members 4 disposed in contact with each other in a standing manner, so that the micro lens array 3 connects to the substrate 8 without adhesion bond. Further, the micro lens array 3 connects to the substrate 8 at a boundary having a micro concavity and convexity shape. Specifically, both of the foreside surface and the bottom surface of the micro lens array 3 have a concavity and convexity shape, which has a concavo-convex surface in one horizontal direction X, and has a continuous surface in the other horizontal direction Y. Here, the one horizontal direction X is parallel to the flat inlet surface 3a, and the other horizontal direction Y is perpendicular to the inlet surface 3a. The light passes through the micro lens array 3, i.e., a silicon oxide block formed integrally with the substrate 8.

The columnar member 4 is disposed parallel to a light path of a transmitted light TB in the other horizontal direction Y. Here, an incident light IB enters the micro lens array 3, and outputs as the transmitted light TB. Thus, an extending direction of the columnar member 4, i.e., the other horizontal direction Y is parallel to the light path of the transmitted light TB, so that an angle between the light path and the extending direction of the columnar member 4 becomes smaller than the total reflection angle between the silicon oxide and the air. Therefore, the transmittance of the light is improved, i.e., the transmittance of the light is prevented from being reduced. Here, in general, the transmittance of the light is reduced because of the scattering of light and so on.

The micro lens array 3 integrally formed with the substrate 8 has a connection portion 5 as a base. The connection portion 5 is disposed lower side of the micro lens array 3, and made of silicon. The connection portion 5 has a concavity and convexity shape. In the concavity 2, a clearance 6 is disposed between the micro lens array 3 and the substrate 8. Specifically, the clearance 6 is disposed around a periphery of the micro lens array 3. Thus, the micro lens array 3 is separated from the substrate 8 with the clearance 6, so that the micro lens array 3 is limited from buckling in case of forming the micro lens array 3, as described later.

The micro lens array 3 has a height H in a vertical direction Z, which is equal to or larger than 10 μm, i.e., a thickness H of the micro lens array 3 is equal to or larger than 10 μm. Preferably, the height H of the micro lens array 3 is equal to or larger than 100 μm. The micro lens array 3 has a width W in the one horizontal direction X, which is about 500 μm.

Further, the micro lens array 3, i.e., the silicon oxide block connects to the substrate 8 without any adhesion bond, so that the micro lens array 3 has a high heat radiation property. For example, the optical device 1 can be used for collimating a high power laser beam. The laser beam is outputted from the laser device 7. In this case, since the micro lens array 3 is small, it is required to approach the laser device 7 to the micro lens array 3. Specifically, in a case where the laser beam has a spreading angle of 90°, a distance L between the laser device 7, i.e., an emission outlet of the laser beam, and the micro lens array 3 is about 100 μm. That is, the emission outlet of the laser device 7 is approached to the inlet surface 3a of the micro lens array 3 within about 100 μm. In this case, the micro lens array 3 absorbs the laser beam so that the temperature of the micro lens array 3 may be increased. However, the micro lens array 3 according to the first embodiment is limited from increasing its temperature. That is because the micro lens array 3 connects to the silicon substrate 8 without any adhesion bond. Specifically, the micro lens array 3, i.e., the silicon oxide block has high heat conductivity, which is much higher than that of glass. Thus, heat generated in the micro lens array 3 conducts to the silicon substrate 8 easily and rapidly.

Figure 3:
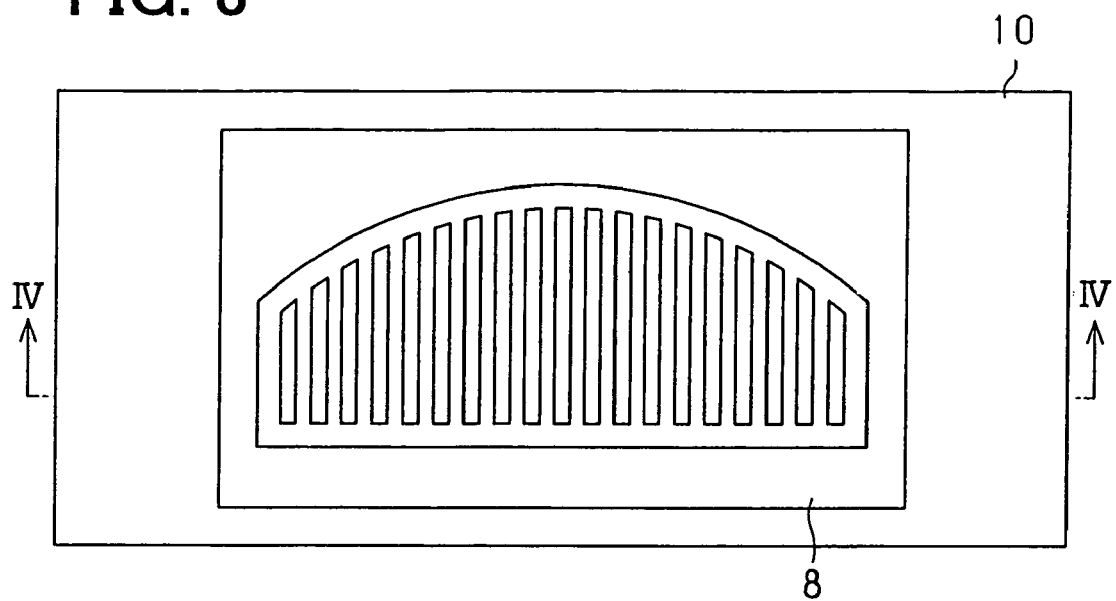
FIG. 3 is a plan view explaining a method for manufacturing the device according to the first embodiment.
Figure 4:
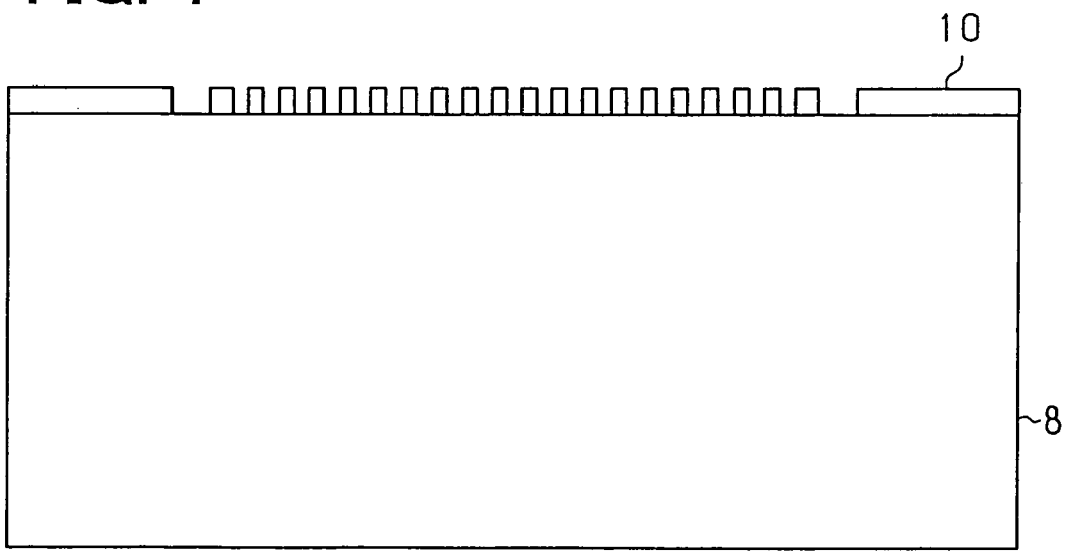
FIG. 4 is a cross-sectional view showing the device taken along line IV-IV in FIG. 3.
Figure 5:
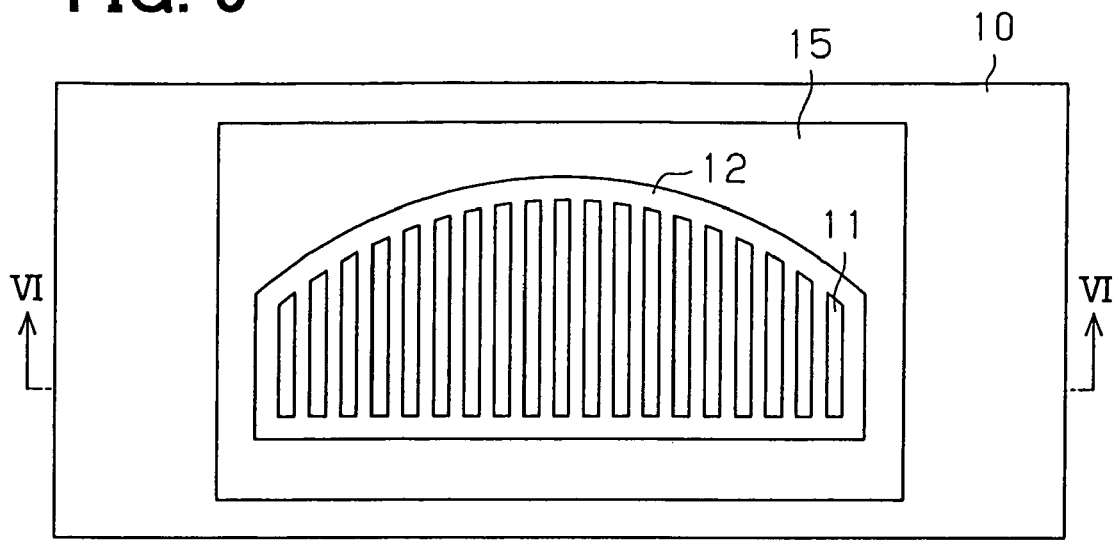
FIG. 5 is a plan view explaining the method for manufacturing the device according to the first embodiment.
Figure 6:
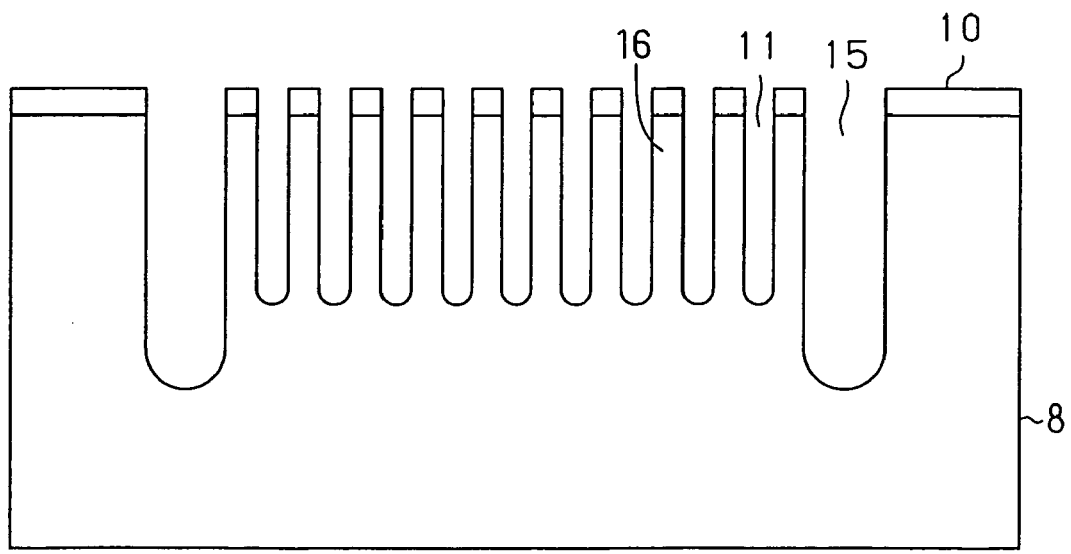
FIG. 6 is a cross-sectional view showing the device taken along line VI-VI in FIG. 5.

Next, the optical device 1 having the micro lens array 3 is manufactured as follows. As shown in FIGS. 3 and 4, an oxide film mask 10 is formed on the substrate 8. Then, the mask 10 is patterned to have a micro lens shape. Next, the substrate 8 is etched through an opening of the oxide film mask 10 so that a trench 11 is formed, as shown in FIGS. 5 and 6. Thus, in the first process, the silicon substrate 8 is etched with using the mask 10 patterned into a predetermined pattern, so that a plurality of trenches 11 and an outside trench 15 are formed. Each trench 11 has the same width, and the same distance therebetween. In this way, the trenches 11 are aligned in the same direction and aligned parallel to the light path, i.e., the other horizontal direction. Here, the trenches 11 are disposed in a lens-to-be-formed region, which provides to be a micro lens array 3. The width of the trench 11 and the width of a silicon wall 16, which is disposed between the trenches 11, are controlled such that a ratio between the widths of the trench 11 and the silicon wall 16 is set to be 0.55:0.45. Therefore, the opening of the mask 10 and the distance between the openings of the mask 10 are pre-determined to become the ratio of 0.55:0.45. For example, assuming that the width of the trench 11 is 1.1 μm, the width of the silicon wall 16 becomes 0.9 μm. Assuming that the width of the trench 11 is 2.2 μm, the width of the silicon wall 16 becomes 1.8 μm.

Next, the substrate 8 is annealed in hydrogen atmosphere so that surface roughness of a sidewall of the trench 11 or the outside trench 15 becomes small. The surface roughness, i.e., the flatness of the sidewall of the trench 11, 15, specifically, the flatness of the sidewall disposed on the outmost periphery in the lens-to-be-formed region (i.e., the sidewall of the outside trench 15) is much important, because the sidewall of the outmost periphery becomes to be the inlet or outlet surface 3a, 3b. Therefore, after forming the trench 11, 15 with using the etching method, the sidewall of the trench 11, 15 is smoothed by annealing in the hydrogen atmosphere. Thus, the micro lens array 3 has a smooth surface, specifically, the smooth inlet or outlet surface 3a, 3b. This smoothing technique is disclosed in Japanese Unexamined Patent Application Publication 2002-231945.

Figure 7:
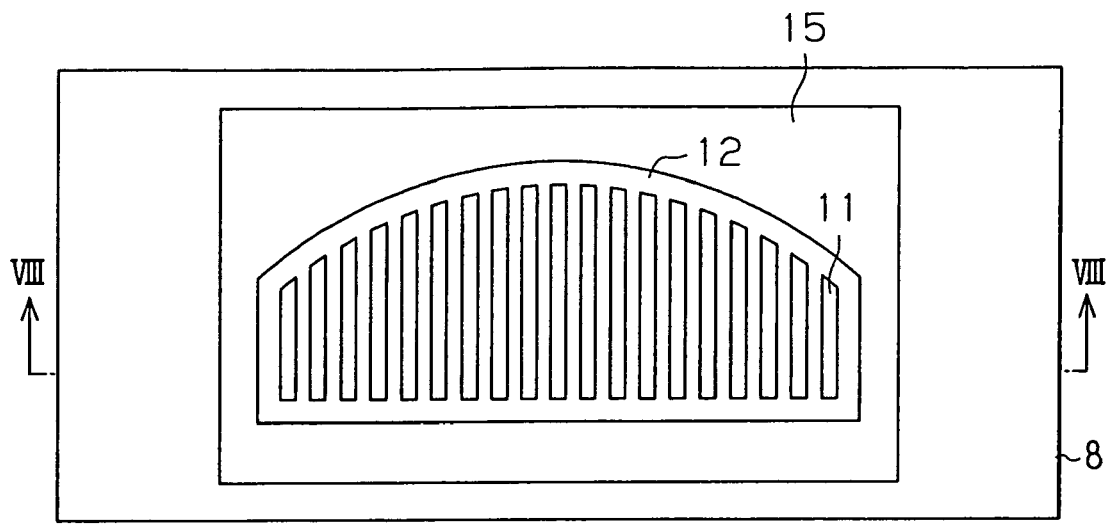
FIG. 7 is a plan view explaining the method for manufacturing the device according to the first embodiment.
Figure 8:
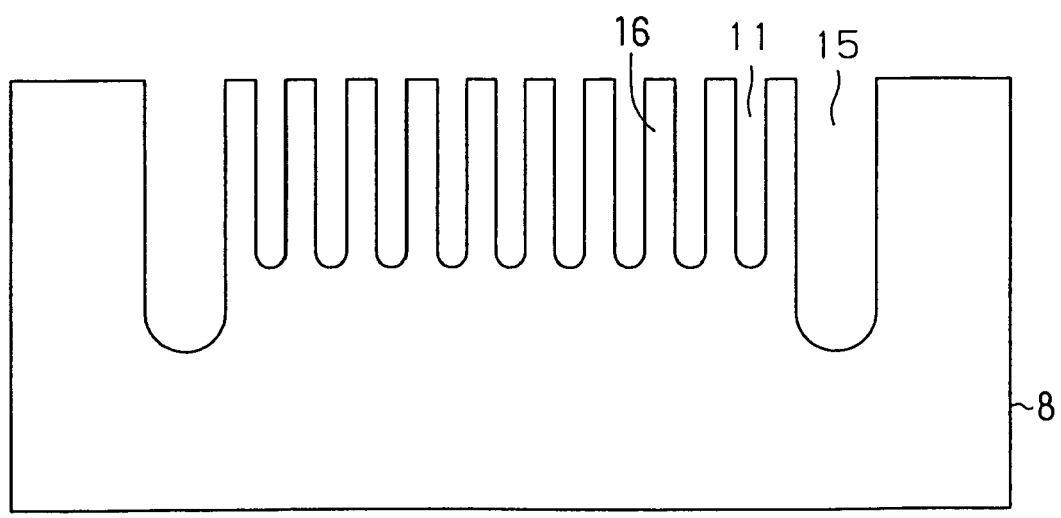
FIG. 8 is a cross-sectional view showing the device taken along line VIII-VIII in FIG. 7.
Figure 9:
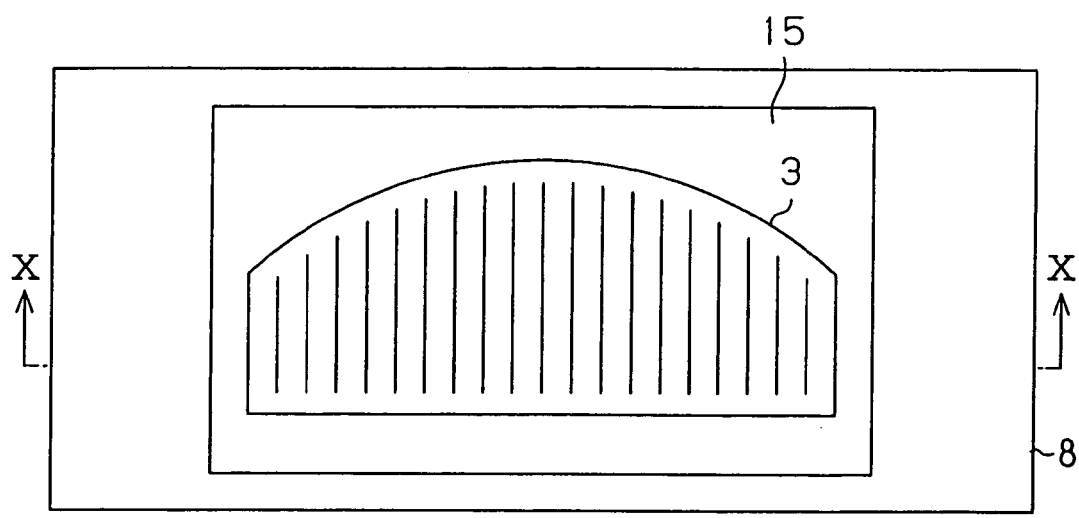
FIG. 9 is a plan view explaining the method for manufacturing the device according to the first embodiment.
Figure 10:
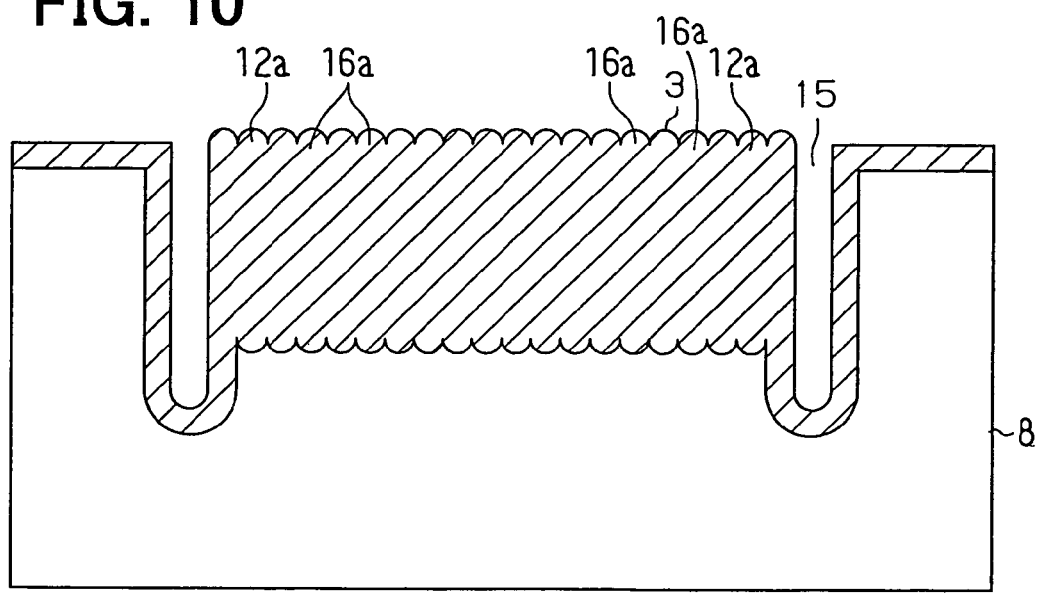
FIG. 10 is a cross-sectional view showing the device taken along line X-X in FIG. 9.

Next, as shown in FIGS. 7 and 8, the substrate 8 is dipped into hydrofluoric acid so that the oxide film mask 10 is removed. Then, as shown in FIGS. 9 and 10, the trench 11 is filled with silicon oxide with using thermal oxidation method as the second process after the trench 11, 15 is formed. At that time, the silicon wall 16 disposed between the trenches 11 is transformed to silicon oxide, and the outside trench 15 is covered with the silicon oxide. Here, the substrate 8 is thermally oxidized in a thermal oxidation process. The silicon oxide is formed in the trench 11 so that the trench 11 is filled with the silicon oxide. Further, the silicon wall 16 is oxidized so that the silicon wall 16 is transformed into a silicon oxide wall 16a. Thus, the micro lens array 3 as a light transmission block (i.e., the silicon oxide block) is formed integrally with the substrate 8.

In this process, the thickness of the silicon oxide to be formed in the thermal oxidation process is set to be equal to or larger than a total thickness of the widths of the trench 11 and the silicon wall 16. In general, the thermal oxidation proceeds toward the inside of the silicon wall 16 so that the silicon wall 16 is transformed to the silicon oxide wall 16a, and the thermal oxidation forms the silicon oxide on the surface of the silicon wall 16 so that the silicon oxide is provided toward the outside of the silicon wall 16. Here, a ratio of a processing speed of the transformation toward the inside of the silicon wall 16 and a processing speed of the formation of the silicon oxide toward the outside of the silicon wall 16 is, in general, 0.45:0.55. In this embodiment, the ratio between the widths of the trench 11 and the silicon wall 16 is set to be equal to the ratio of the processing speeds (i.e., 0.45:0.55), so that the silicon oxide is formed in the trench 11, and simultaneously the silicon wall 16 is transformed to the silicon oxide wall 16a completely. Therefore, the trench 11 is filled with the silicon oxide completely, and at the same time, the silicon wall 16 is transformed to the silicon oxide wall 16a completely. Thus, the lens-to-be-formed region becomes the silicon oxide block, so that the micro lens array 3 is completed.

Thus, after the mask 10 defines a plurality of periodic trenches 11 disposed on the substrate 8 so as to prepare the lens-to-be-formed region having the periodic trenches 11, the trench 11 is formed with using the etching method. Then, the lens-to-be-formed region is thermally oxidized so that the trench 11 is filled with the silicon oxide and at the same time, the silicon wall 16 disposed between the trenches 11 is transformed to the silicon oxide wall 16a. Therefore, the lens-to-be-formed region becomes the silicon oxide block, so that the micro lens array 3 is completed.

It is preferred that an anti-reflection film is coated on the substrate 8 after the thermal oxidation process. The anti-reflection film improves the transmittance of light in the optical device 1.

Further, a periphery silicon wall 12 is disposed at the outmost periphery in the lens-to-be-formed region. Here, the outmost periphery, i.e., the periphery silicon wall 12 defines the outer shape (i.e., the outline) of the micro lens array 3. Specifically, the bolder line of the periphery silicon wall 12 in the lens-to-be-formed region defines the outline of the micro lens array 3. The periphery silicon wall 12 having a predetermined width is connected and surrounds the lens-to-be-formed region. Therefore, the outside trench 15 surrounds the lens-to-be-formed region, i.e., the periphery silicon wall 12.

The shape of the periphery silicon wall 12, i.e., the outline of the periphery silicon wall 12 defines a curvature of the inlet or outlet surface 3a, 3b of the micro lens array 3. Therefore, as long as the mask 10 is prepared to have a certain pattern, the shape of the periphery silicon wall 12 can be controlled to have any shape, i.e., any curved surface or any flat surface.

Figure 13A:
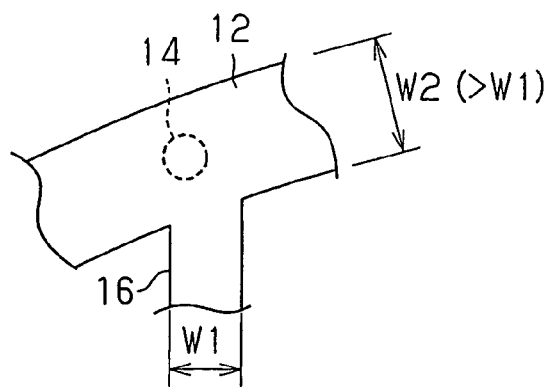
FIGS. 13A and 13B are a partial plan view showing a T-shaped connection of the device according to the first embodiment.
Figure 13B:
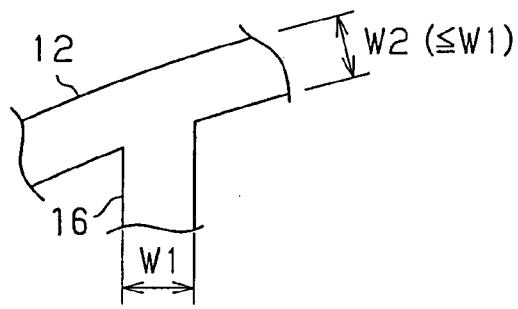

Further, the width W2 of the periphery silicon wall 12 is set to be equal to or smaller than the width W1 of the silicon wall 16. The reason of the above construction is described as follows. As shown in FIGS. 13A and 13B, the silicon wall 16 and the outside silicon wall 12 are connected to have a T-shape. Here, the oxidation speed of the outside silicon wall 12 at the T-shaped connection becomes late compared with the other portion in the lens-to-be-formed region. Therefore, in a case where the width W2 of the outside silicon wall 12 is larger than the width W1 of the silicon wall 16, a non-oxidized region 14 may be formed in the T-shaped connection of the outside silicon wall 12, as shown in FIG. 13A. Therefore, in a case where the width W2 of the outside silicon wall 12 is set to be equal to or smaller than the width W1 of the silicon wall 16, the non-oxidized region 14 is limited from being formed in the outside silicon wall 12, as shown in FIG. 13B.

As shown in FIGS. 5 and 6, the outside trench 15 disposed on the outside of the lens-to-be-formed region (i.e., the outer periphery of the lens-to-be-formed region) has a wide width, which is sufficiently wider than the width of the trench 11. Therefore, as shown in FIG. 10, the outside trench 15 disposed on the outer periphery of the lens-to-be-formed region has a sufficient clearance after the silicon oxide is formed on the surface of the outside trench 15 in the thermal oxidation process. Thus, no buckling is occurred in the outside trench 15. If the width of the outside trench 15 is not sufficient, the silicon oxide block may be buckled or cracked after the thermal oxidation because the outmost periphery of the silicon oxide block pushes the substrate 8.

Figure 12:
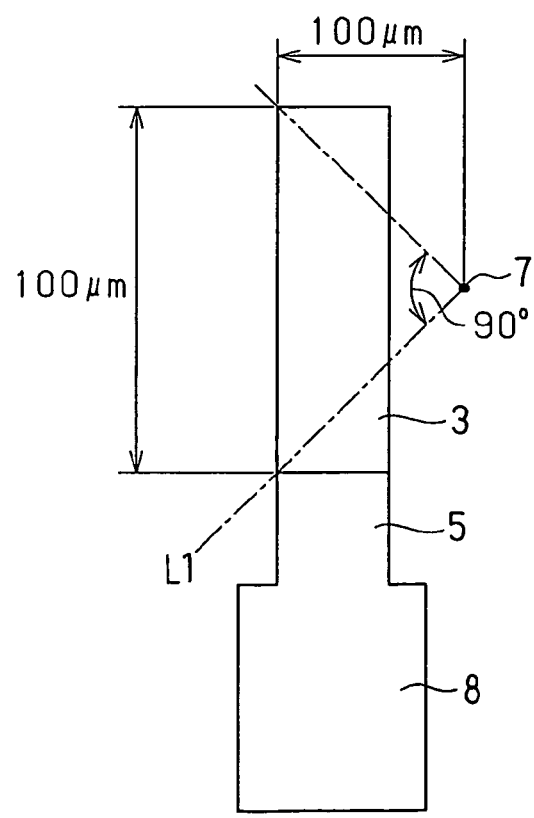
FIG. 12 is a cross-sectional view showing the device taken along line XII-XII in FIG. 2A.

Further, the outside trench 15 is deeply etched compared with the trench 11 disposed in the lens-to-be-formed region because of the micro loading effect in the trench etching process. Specifically, the depth of the outside trench 15 is larger than that of the trench 11. This configuration of trenches 11, 15 is significant for providing the light path freely in case of entering or outputting the light. Specifically, the micro lens array 3 formed integrally with the silicon substrate 8 includes the connection portion 5 disposed under the micro lens array 3 so that the light L1 is not prevented in case of entering or outputting from the micro lens array 3, as shown in FIG. 12. Here, the light is emitted from the light source 7, so that the light spreads toward the micro lens array 3. The spreading angle of the light is about 90°, and the distance between the light source 7 and the micro lens array 3 is 100 µm. The height of the micro lens array 3 is also 100 µm. Thus, if the depth of the outside trench 15 is shallow and the device has no connection portion 5, the light may be prevented by the substrate 8. Specifically, the light L1 is prevented by the substrate 8.

When the trenches 11, 15 are formed in the trench etching process, it is required that the each trench 11, 15 has a large aspect ratio. The aspect ratio is defined as a ratio between the depth and the width of the trench 11, 15. When the trench 11, 15 has a large aspect ratio, the micro lens array 3 becomes a stereoscopic shape.

Further, it is required that the trench 11, 15 does not have a tapered shape, an inverse tapered shape, nor a bowing shape (i.e., a barrel shape). That is because a void, i.e., defect may be generated after the thermal oxidation process if the trench 11, 15 has the above shape. Accordingly, it is important to secure uprightness (i.e., perpendicularity) of the sidewall of the trench 11, 15. Here, the tapered shape of the trench 11, 15 provides that the width of the trench 11, 15 disposed around an opening thereof is larger than that around the bottom of the trench 11, 15 in relation to the cross-section profile of the trench 11, 15. The inverse tapered shape of the trench 11, 15 provides that the width of the trench 11, 15 disposed around an opening thereof is smaller than that around the bottom of the trench 11, 15 in relation to the cross-section profile of the trench 11, 15. The bowing shape provides that the width of the trench 11, 15 disposed around a center thereof is larger than that around the opening thereof or around the bottom of the trench 11, 15 in relation to the cross-section profile of the trench 11, 15.

In view of the above requirement, the trench 11, 15 is formed with using a method disclosed in Japanese Patent Application Publication No. 2000-299310. Specifically, firstly, a passivation oxide film is formed on the inside surface (i.e., the sidewall and the bottom surface) of an initial trench. Then, the passivation oxide film disposed on the bottom surface of the initial trench is removed with using a reacting ion etching method. Subsequently, the bottom surface of the initial trench is etched so that the silicon substrate 8 is etched. Then, the passivation oxide film is formed again, and the bottom surface of the trench is etched, repeatedly. Thus, the trench 11, 15 having the aspect ratio of about 60 and having the upright sidewall is formed.

Accordingly, firstly, the initial trench is formed with using the reactive ion etching method, and then the passivation oxide film is formed on the inside of the initial trench. Further, the passivation oxide film disposed on the bottom surface of the initial trench is etched, and then the bottom surface of the trench, i.e., the silicon substrate 8 is further etched so as to entrench deeply. Thus, the trench 11, 15 having the large aspect ratio is completed.

Figure 11:
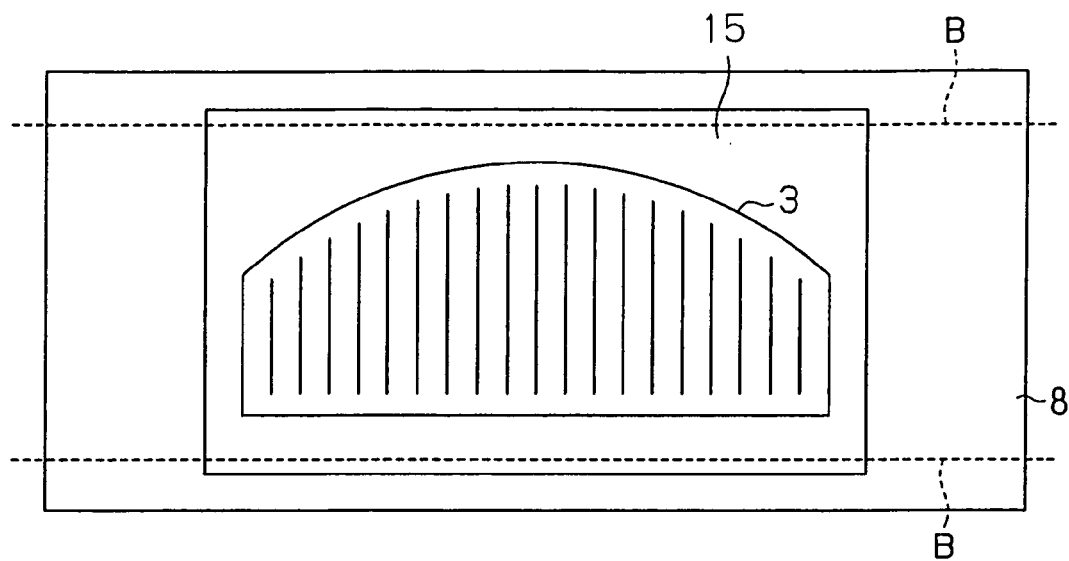
FIG. 11 is a plan view explaining the method for manufacturing the device according to the first embodiment.

After the micro lens array 3 as the light transmission block is formed integrally with the substrate 8, as shown in FIGS. 9 and 10, the substrate 8 is cut along with a line B shown in FIG. 11. Here, the line B passes through the outside trench 15. The cutting is performed by a dicing cut method. Thus, the optical device 1 with the micro lens array 3 having a cylindrical lens is completed.

When the ratio between the widths of the trench 11 and the silicon wall 16 is 0.55:0.45, which is a theoretical ratio, the cylindrical lens has no clearance, i.e., no defect in the lens so that the cylindrical lens is completely formed of silicon oxide. Thus, the cylindrical lens is not deformed. However, when the mask 10 is formed on the substrate 8, or when the trench 11 is formed with using the trench etching method, the mask 10 or the trench 11 may have a variation in dimensions, so that the ratio between the widths of the trench 11 and the silicon wall 16 becomes different from the theoretical ratio, i.e., 0.55:0.45.

If the width of the trench 11 becomes relatively larger than the theoretical ratio, the trench 11 is not filled with the silicon oxide completely so that the void is generated. However, when this void is sufficiently small in relation to the wavelength of the light passing through the cylindrical lens, and the light path is parallel to the longitudinal direction of the void, an inhomogeneity in the cylindrical lens caused by the void does not affect to the performance of the cylindrical lens substantially. Here, in general, the void or the boundary between the void and the silicon oxide works as a lens for scattering the light or for deflecting the light, so that the inhomogeneity of the cylindrical lens arises.

If the width of the silicon wall 16 becomes relatively larger than the theoretical ratio, the silicon wall 16 disposed between the trenches 11 is completely transformed into the silicon oxide and the trench 11 is over-filled with the silicon oxide. Thus, since the width of the silicon wall 16 becomes larger, the cylindrical lens expands in volume. Specifically, the cylindrical lens expands in a horizontal direction, and may be deformed. In this embodiment, the micro lens array 3 is surrounded by the outside trench 15 so that the expanded cylindrical lens does not press the sidewall of the substrate 8 disposed around the cylindrical lens. Therefore, the expanded cylindrical lens is not deformed.

The optical device 1 according to the first embodiment is described in detail as follows. The cylindrical lens, i.e., the micro lens array 3 can be formed to have a predetermined shape, which is provided by the mask 10 having a predetermined pattern. The cylindrical lens has homogeneity in the vertical direction Z, which is perpendicular to the substrate 8. Here, the mask pattern defines the shape of the micro lens array 3 when the trench 11, 15 is formed in the trench etching process. Accordingly, the micro lens array 3 having a predetermined shape can be formed as planned. Therefore, the mask pattern is changed so that the trench 11, 15 is formed to have a different shape or a different configuration. Accordingly, the optical device 1 has high design freedom.

Here, the mask pattern has a certain pattern, which is a line and space type pattern having a predetermined ratio between a line and a space aligned periodically and continuously. Specifically, the line corresponds to the silicon wall 16, and the space corresponds to the trench 11. And the ratio between the width of the line and the width of the space is 0.45:0.55. The trench etching is performed with using the mask 10 having the ratio of 0.45:0.55. In this trench etching process, the trench 11 has the large aspect ratio. After that, whole the substrate 8 is thermally oxidized so that the silicon oxide is formed in the trench 11 and the silicon wall 16 is transformed into the silicon oxide wall 16a. Thus, the lens-to-be-formed region disposed on the substrate 8 is changed into the silicon oxide block (i.e., the light transmission block) so that the micro lens array 3 is formed.

In this process, the mask 10 has the line and space type pattern. The reason why the mask 10 has the line and space type pattern is described in detail as follows. In general, a ratio of a processing speed of the transformation toward the inside of the silicon wall 16 and a processing speed of the formation of the silicon oxide toward the outside of the silicon wall 16 is 0.45:0.55. In this embodiment, the ratio between the widths of the trench 11 and the silicon wall 16 is set to be equal to the ratio of the processing speeds, so that the silicon oxide is formed in the trench 11, and simultaneously the silicon wall 16 is transformed to the silicon oxide wall 16a completely. Therefore, the trench 11 is filled with the silicon oxide completely, and at the same time, the silicon wall 16 is transformed to the silicon oxide wall 16a completely. Thus, the lens-to-be-formed region becomes the silicon oxide block, so that the micro lens array 3 is completed. With using this method, any region disposed in the silicon substrate 8 can be changed into the silicon oxide to the depth of the trench 11. The mask 10 having the line and space pattern is formed on the substrate 8 so as to form a lens shape viewed from above the substrate 8, so that the silicon oxide block having the lens shape is obtained by the above manufacturing method. This lens is the cylindrical lens having the homogeneity in the vertical direction Z, which is perpendicular to the substrate 8.

If the silicon oxide layer is deposited on the substrate 8, specifically, on the lens-to-be-formed region defined by a mask pattern, so as to form the cylindrical lens with using chemical vapor deposition (i.e., CVD) method, the thickness of the cylindrical lens is limited to be equal to or smaller than 10 μm. That is because the silicon oxide layer is formed by deposition.

On the other hand, the above method with the trench etching method having large aspect ratio provides the cylindrical lens having the thickness thereof being equal to or larger than 100 μm. Thus, the micro lens array 3 as the cylindrical lens is useful and has a three dimensional lens (i.e., a stereoscopic lens).

Figure 14A:
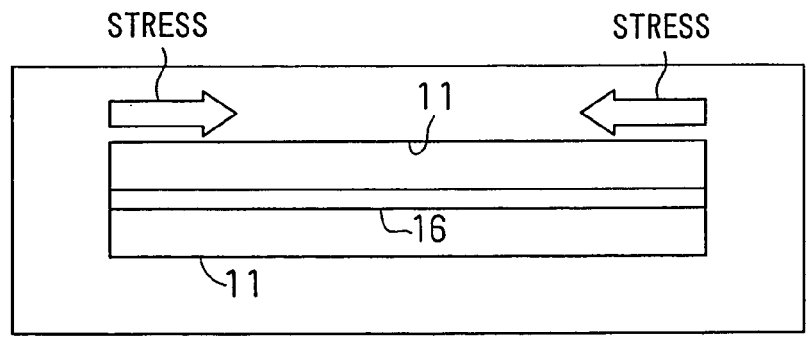
FIGS. 14A and 14B are plan views explaining a deformation of a silicon oxide wall, according to the first embodiment.
Figure 14B:
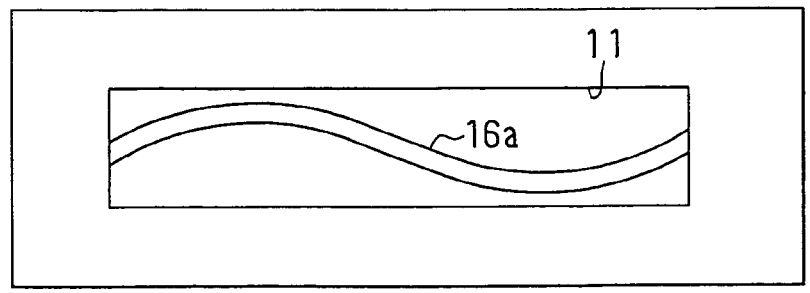
Figure 15A:
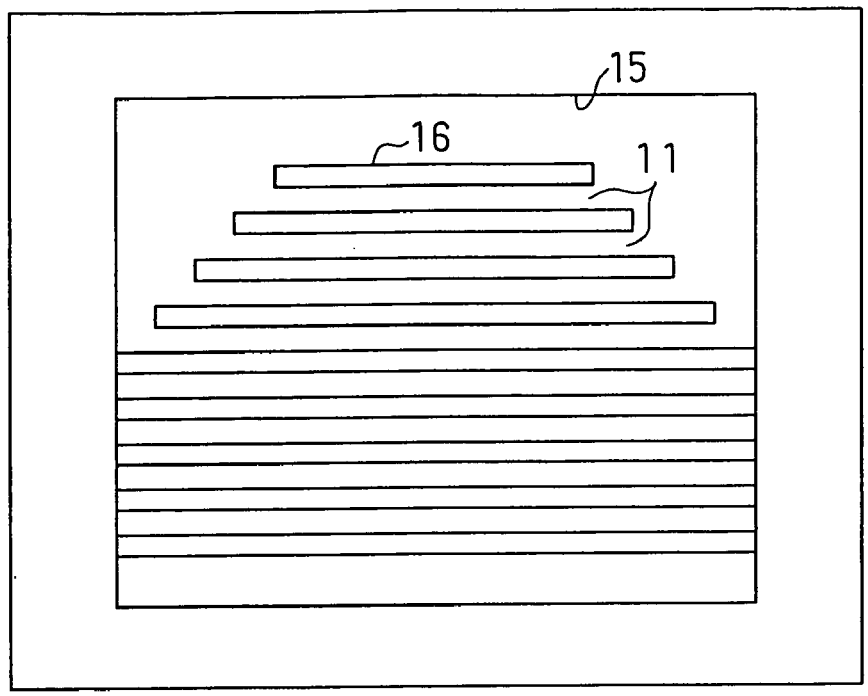
FIGS. 15A and 15B are plan views explaining the deformation of the silicon oxide wall, according to the first embodiment.
Figure 15B:
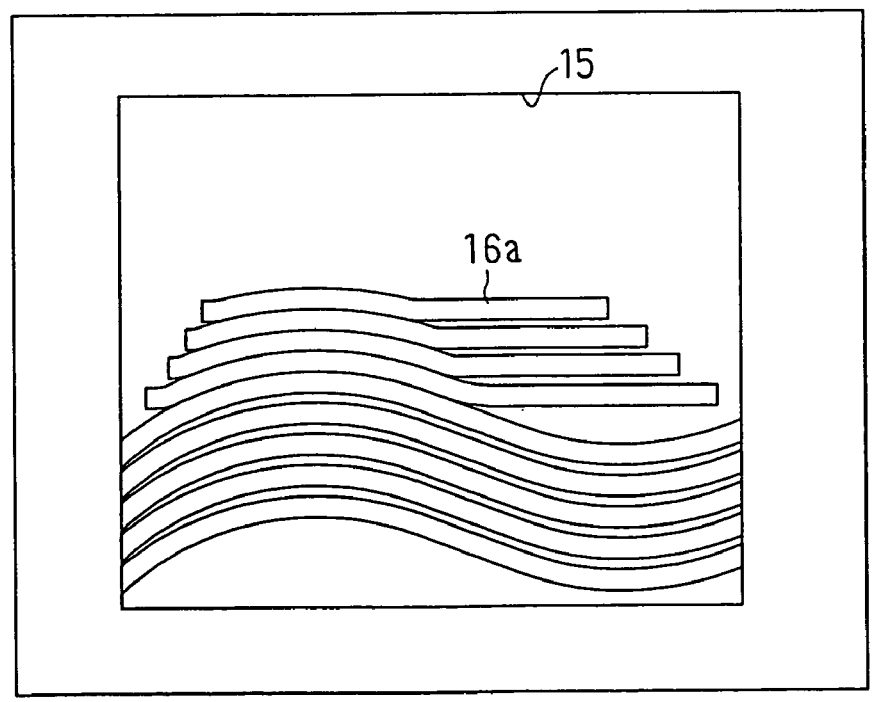

In general, coefficient of linear thermal expansion of silicon is different from that of silicon oxide. For example, the coefficient of the silicon is $2.6 \times 10^{-6}/°$ C. at 20° C., and the coefficient of the silicon oxide (i.e., fused silica) is $0.4 \sim 0.5 \times 10^{-6}/°$ C. at 20° C. These values are described in Science Chronology compiled by National Astronomical Observatory of Japan. Accordingly, the silicon wall 16 may be compressed and buckled because of the difference of the coefficient, as shown in FIGS. 14A and 14B. Here, it is assumed that a pair of trenches 11 is formed in the substrate 8 so that the silicon wall 16 having a plate shape is formed on the substrate 8. The substrate 8 is thermally oxidized so that the silicon wall 16 is transformed into the silicon oxide wall 16a. At this time in a case where the substrate 8 is cooled down to a room temperature, the silicon oxide wall 16a having the plate shape is applied with a compression stress from the both ends so that the silicon oxide wall 16a may be buckled. Therefore, it is assumed that a plurality of trenches 11 is formed in the substrate 8 so that a plurality of silicon walls 16 is formed in the substrate 8, as shown in FIGS. 15A and 15B. Here, each silicon wall 16 is disposed parallel each other. Then, the substrate 8 is thermally oxidized so that the silicon wall 16 is transformed into the silicon oxide wall 16a. At this time in a case where the substrate 8 is cooled down to a room temperature, the silicon oxide wall 16a having the plate shape is applied with a compression stress from the both ends so that the silicon oxide wall 16a may be buckled. Thus, the cylindrical lens having a predetermined shape may not be obtained.

However, in the first embodiment, the lens-to-be-formed region is surrounded with the outside trench 15. When the substrate 8 is cooled down to a room temperature, the cylindrical lens is not applied with the compression stress from the surface of the substrate 8. Therefore, the silicon oxide wall 16a having the plate shape is not buckled.

Further, the outside silicon wall 12 surrounds the periphery of the lens-to-be-formed region. Each silicon oxide wall 16a is connected together with the outside silicon oxide wall 12a. Therefore, the silicon oxide wall 16a is not buckled nor fallen down.

The extending direction of the trench 11 is parallel to the light path of the transmitted light TB. Specifically, a plurality of trenches 11 disposed parallel each other is parallel to the light path of the transmitted light TB. As shown in FIG. 2, the micro lens array 3 has a boundary 4a disposed parallel to a light axis A of the micro lens array 3. The boundary 4a is formed between the silicon oxide wall 16a and the silicon oxide formed in the trench 11. Therefore, the transmittance of the light of the cylindrical lens is limited from reducing. Here, the transmittance is reduced by reflection or scattering of the light reflected or scattered by the boundary 4a.

Thus, the micro lens array 3 of the device 1 has high design freedom.

Although each trench 11 has the same width, and each silicon wall 16 has the same width, each trench 11 can have a different width, and/or each silicon wall 16 can have a different width.

Second Embodiment

Figure 16A:
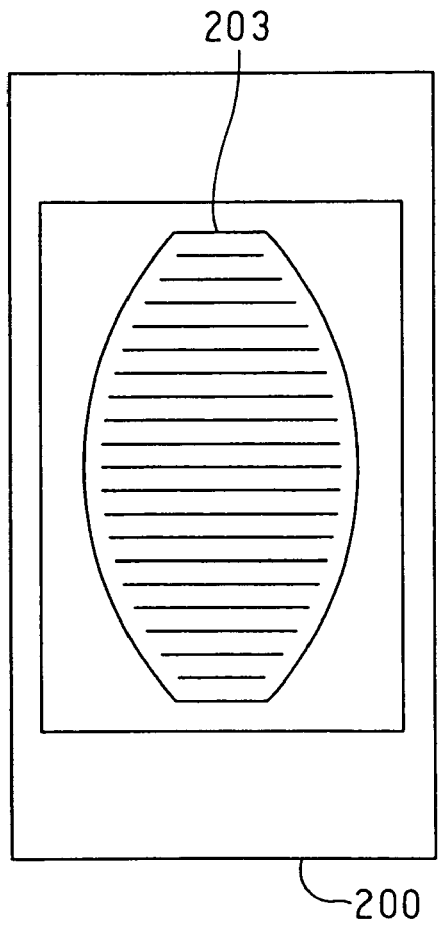
FIGS. 16A and 16B are plan views showing different devices according to a second embodiment of the present invention.
Figure 16B:
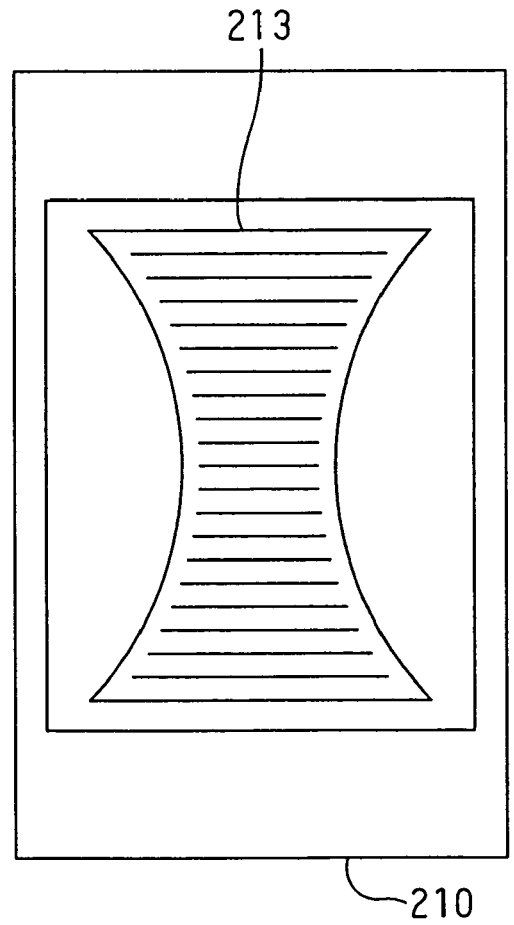
Figure 17A:
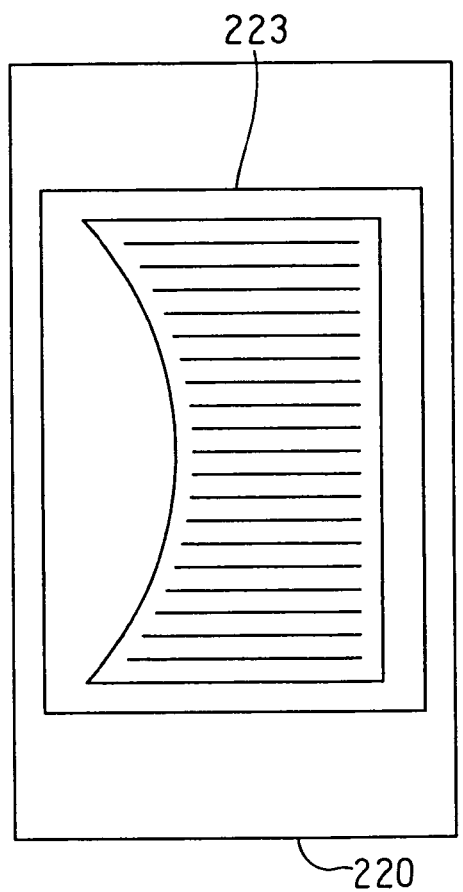
FIGS. 17A and 17B are plan views showing different devices according to the second embodiment.
Figure 17B:
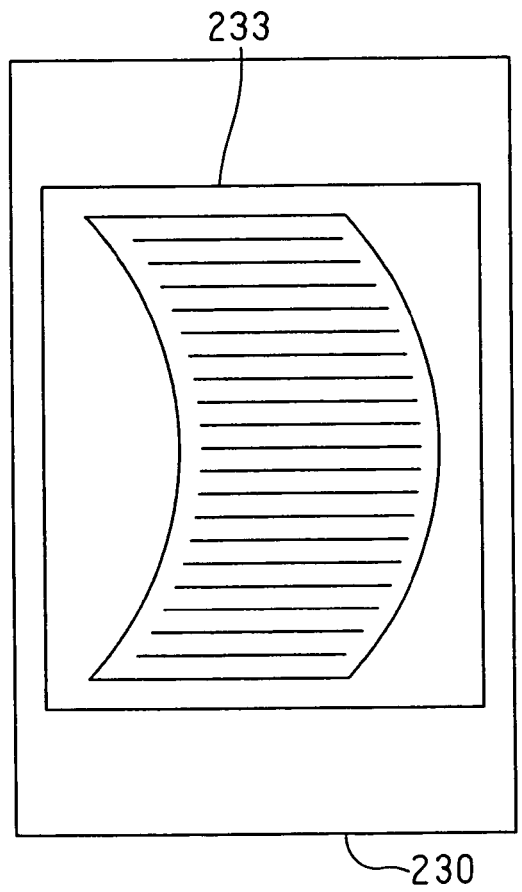

Various optical devices 200, 210, 220, 230, 240, 250 according to a second embodiment of the present invention are shown in FIGS. 16A to 18B. In FIG. 16A, the device 200 has a micro lens array 203 having a cylindrical biconvex lens. The device 210 has a micro lens array 213 having a cylindrical biconcave lens. The device 220 has a micro lens array 223 having a cylindrical plano-concave lens (i.e., a flat type cylindrical concave lens). The device 230 has a micro lens array 233 having a cylindrical meniscus lens. Further, the device can have another micro lens array having any shape. Specifically, the device can have a micro lens array having a large numerical aperture (i.e., a large NA).

Further, the device 240 has a plurality of micro lens arrays 243 having a cylindrical plano-convex lens, as shown in FIG. 18A. Each micro lens array 243 is arranged in parallel. Further, the device 250 has a plurality of micro lens arrays 253a-253c. Each micro lens array 253a-253c is arranged on the same light axis A. Specifically, each micro lens array 253a-253c has the same light axis A. Furthermore, the device 250 can include a slit 254 and the like. The slit 254 can be formed together with the micro lens array 253a-253c.

Thus, a plurality of micro lens arrays or merely lenses, or a micro lens array with a slit are formed together in a patterning, trench etching and thermal oxidation processes, so that these parts are formed in the substrate 8. In this case, a plurality of micro lens array and/or a complicated optical device with a plurality of lenses for passing the light can be formed on the substrate 8 with using one photolithography mask at the same time. Specifically, in case of the complicated optical device, a plurality of lenses is formed at the same time so that light axis of each micro lens is aligned without positioning each lens. Here, the positioning is one of difficult problem in the complicated optical device with a plurality of micro lenses.

Specifically, in a case where a photolithography mask provides a plurality of optical parts including at least one kind of lens, slit or light guide in an optical device, and these parts are formed on a silicon substrate at the same time in trench etching and thermal oxidation processes, light axis in the device is aligned without positioning.

Third Embodiment

Figure 19:
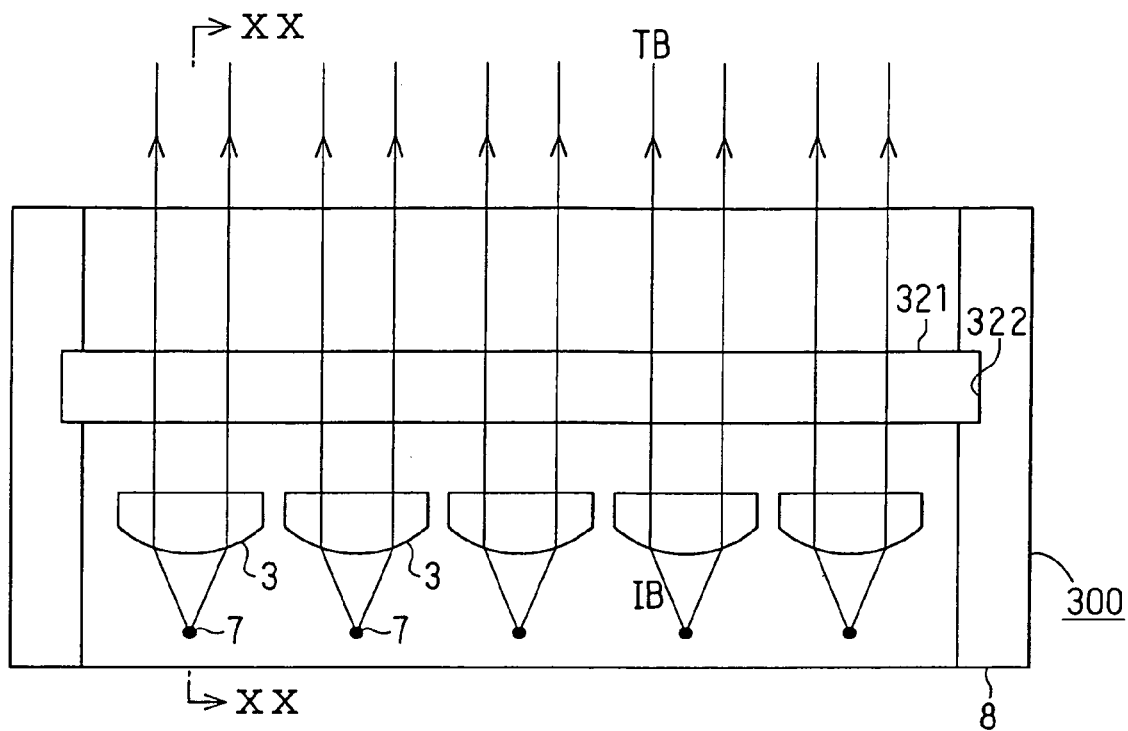
FIG. 19 is a plan view showing an optical device according to a third embodiment of the present invention.
Figure 20:
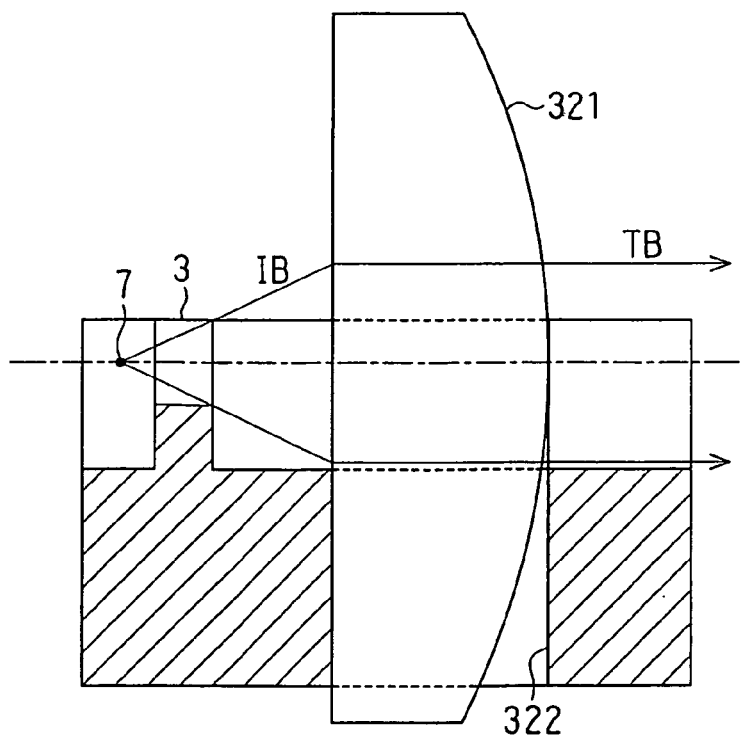
FIG. 20 is a cross-sectional view showing the device taken along line XX-XX in FIG. 19.

An optical device 300 according to a third embodiment of the present invention is shown in FIGS. 19 and 20. The device 300 includes a lens 321 mounted on the silicon substrate 8. The lens 321 is a different part, which is different from the substrate 8 and formed independently from the substrate 8. The lens 321 and a plurality of micro lens arrays 3 are connected optically. The micro lens array 3 is a cylindrical lens so that the incident light IB is collimated and/or condensed in the horizontal direction X, Y only. The lens 321 is another cylindrical lens so that the incident light IB is collimated and/or condensed in the vertical direction Z. Thus, the device 300 can collimate and /or condense the light not only in the horizontal direction X, Y but also in the vertical direction Z.

The silicon substrate 8 has a hole 322 for mounting the lens 321. The hole 322 is formed with using etching method, and the lens 321 is inserted into the hole 322 so that the lens 321 is mounted in the substrate 8. The device 300 can collimate the light radiated from a plurality of light sources 7 such as a semiconductor laser device. In general, the light radiated from the laser device has horizontal and vertical spreading angles. The horizontal spreading angle is much different from the vertical spreading angle. Therefore, the device 300 is required to have two cylindrical lenses, which correspond to the horizontal and vertical spreading angles and collimate the light in the horizontal or vertical direction, respectively. The device 300 has the micro lens arrays 3 for collimating or condensing the light in the horizontal direction X, Y and the lens 321 for collimating or condensing the light in the vertical direction Z, the light having a tendency of expanding in the horizontal and/or vertical direction.

Although the lens 321 is a cylindrical lens, the lens 321 can be a columnar lens.

Fourth Embodiment

An optical device 400 according to a fourth embodiment of the present invention includes the micro lens array 3 as a cylindrical lens having a large height H.

Figure 21A:
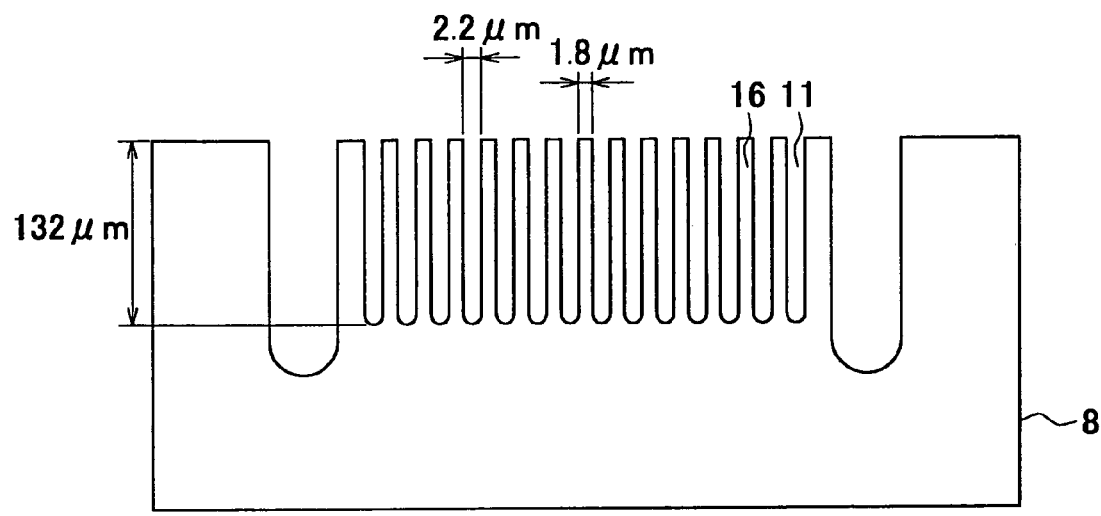
FIGS. 21A and 21B are cross-sectional views explaining a construction of the device shown in FIG. 1.
Figure 21B:
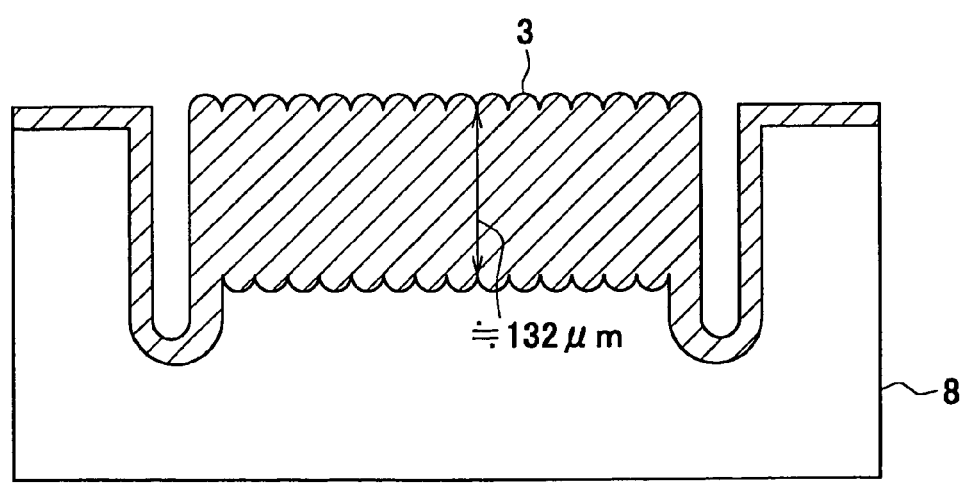

The device 1 shown in FIG. 1 has the height H of the micro lens array 3. The height H is provided by the trench 11 having the aspect ratio of about 60 in the trench etching process. However, it is difficult to obtain the trench 11 having large aspect ratio larger than 60. On the other hand, the silicon wall 16 is thermally oxidized in proportion to a square root of a thermal oxidation time (i.e., a process time). Specifically, the thickness of silicon oxide wall 16a oxidized in an oxidation process is in proportion to the square root of process time. As the thickness of the silicon oxide wall 16a becomes thicker, the process time becomes long. As shown in FIGS. 21A and 21B, in a case where the thickness of the silicon oxide wall 16a is, for example, set to be 2 μm so as to set the process time in a practical range, the width of the trench 11 is set to be 2.2 μm and the width of the silicon wall 16 is set to be 1.8 μm , respectively. This construction provides that the trench 11 is filled with the silicon oxide, and the silicon wall 16 is transformed into the silicon oxide wall 16a completely. In a case where the trench 11 has the width of 2.2 μm and the aspect ratio of 60, a depth of the trench 11 becomes about 132 μm. Therefore, the micro lens array 3 has the height H of 132 μm.

Figure 22A:
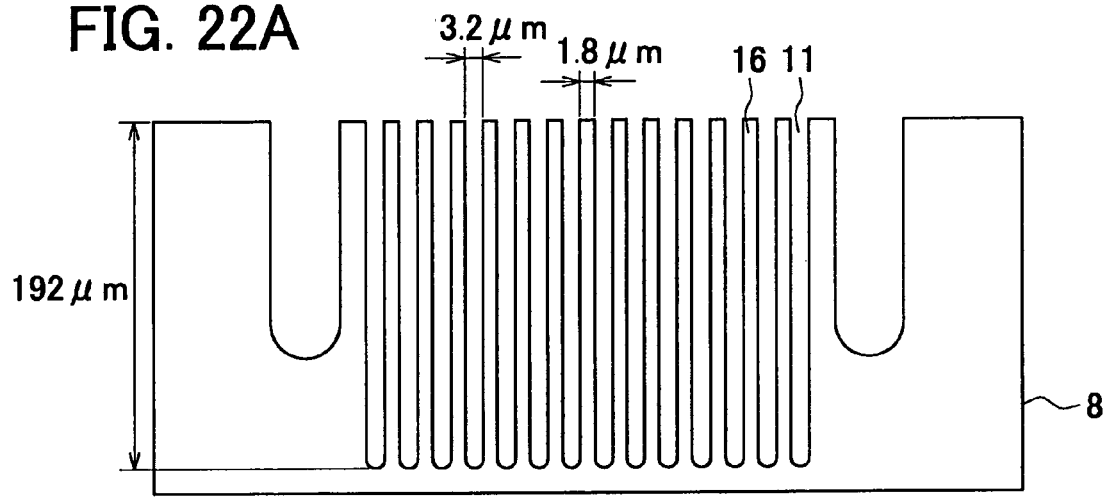
FIGS. 22A to 22C are cross-sectional views explaining a method for manufacturing an optical device according to a fourth embodiment of the present invention.
Figure 22B:
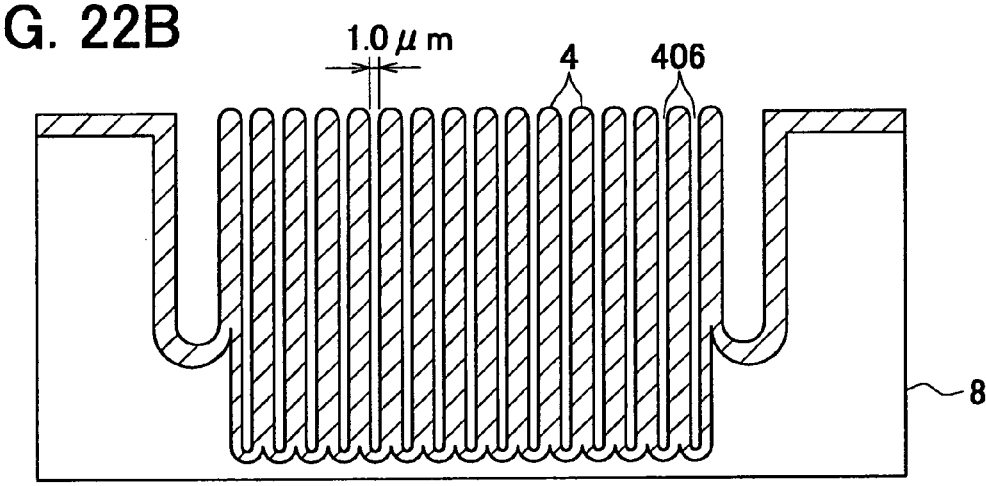
Figure 22C:
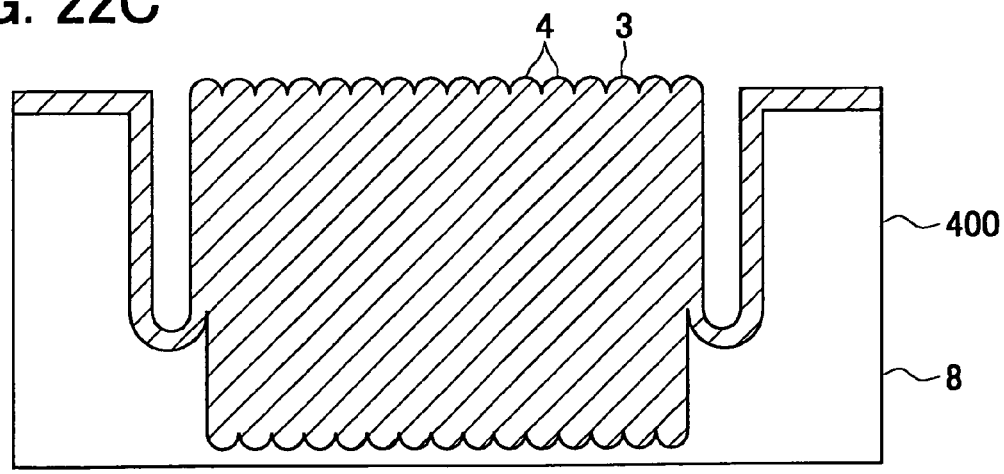

In a case where the micro lens array 3 has larger height H larger than 132 μm, the width of the trench 11 becomes larger so that the depth of the trench 11 having the aspect ratio of 60 becomes larger, as shown in FIGS. 22A-22C. For example, when the width of the trench 11 is set to be 3.2 μm, the depth of the trench 11 becomes 192 μm. However, when the width of the silicon wall 16 is set to be 1.8 μm, and the thickness of the oxidation becomes 2.0 μm, the trench 11 is not filled with the silicon oxide completely, so that the trench 11 has a clearance 406. The clearance 406 has a width of 1.0 μm.

Therefore, as shown in FIG. 22C, the device 400 according to the fourth embodiment is manufactured such that the thermal oxidation is performed after the trench 11 is formed in the substrate 8 with using a deep reactive ion etching method (i.e., a deep RIE method), and then additional oxide film is deposited so as to fill the clearance 406 with the silicon oxide film with using CVD method. In this oxide film deposition process, the clearance 406 is filled with the oxide film. Here, the device 1 shown in FIGS. 21A and 21B is manufactured such that the thermal oxidation is performed after the trench 11 is formed in the substrate 8 with using a deep reactive ion etching method (i.e., a deep RIE method).

Thus, the trench 11 becomes deeply so that the silicon oxide block has a large height H. Specifically, the device 400 includes a micro lens array 3 having a large height H. In the device 400, each columnar member 4 as one of optical parts is connected together and disposed in a standing manner. The columnar member 4 is composed of the silicon oxide wall 16a and the silicon oxide film formed in the trench 11 and in the clearance 406. The silicon oxide wall 16a is formed in the thermal oxidation process and the silicon oxide film deposition process. The silicon oxide film in the trench 11 and in the clearance 406 is also formed in the thermal oxidation process and the silicon oxide film deposition process.

Fifth Embodiment

Figure 23:
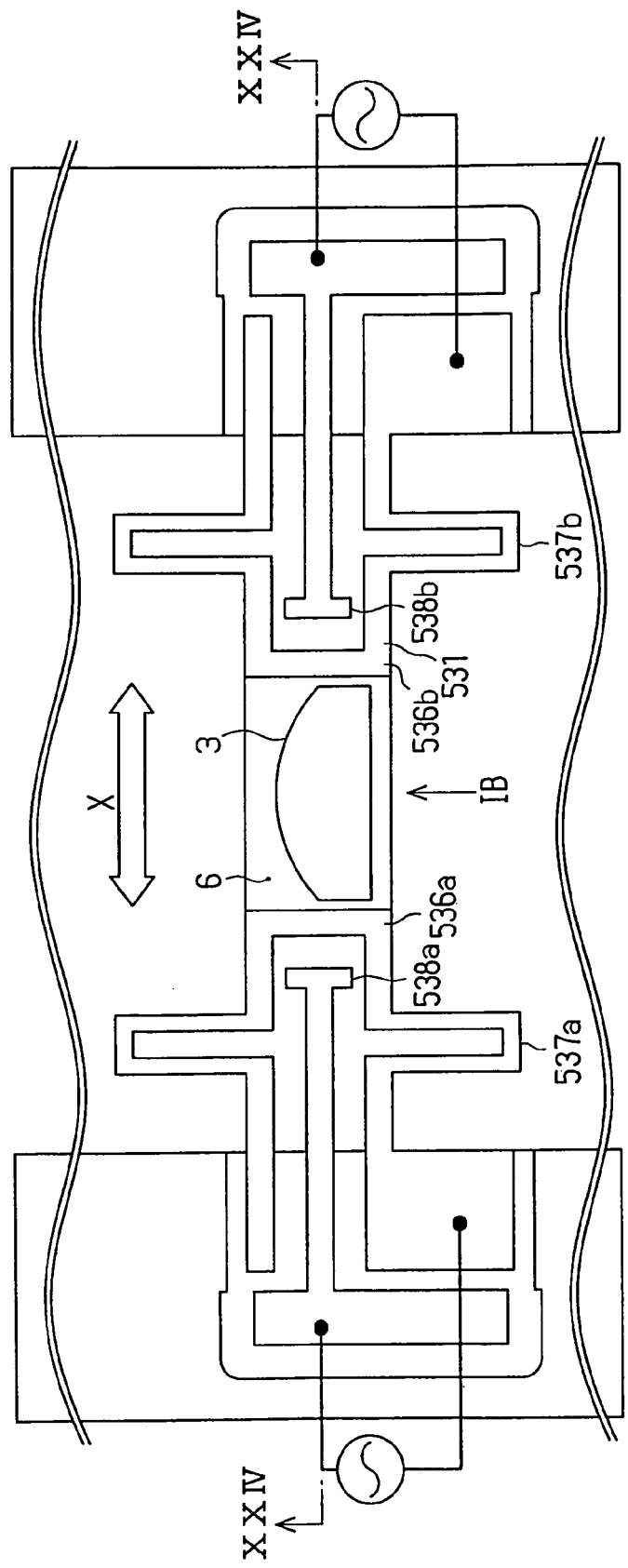
FIG. 23 is a plan view showing an optical device according to a fifth embodiment of the present invention.
Figure 24:
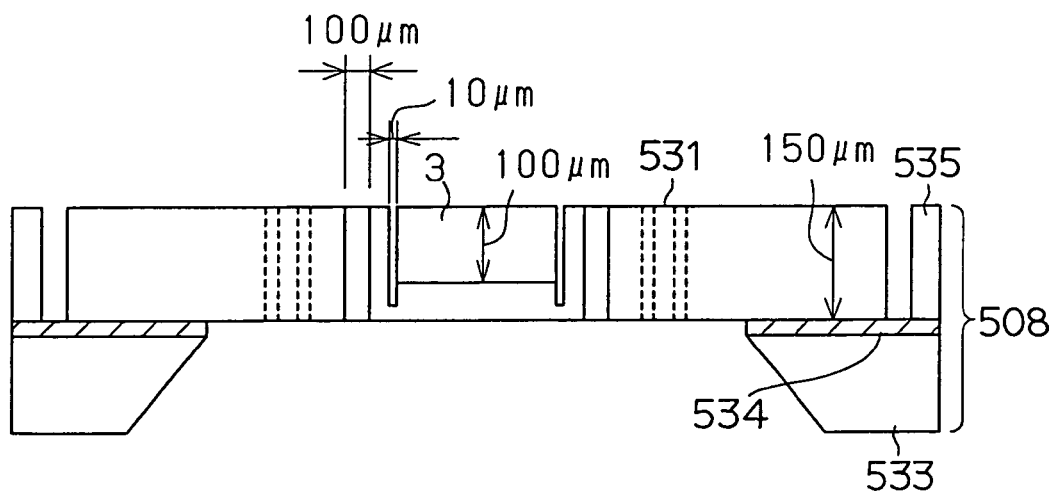
FIG. 24 is a cross-sectional view showing the device taken along line XXIV-XXIV in FIG. 23.
Figure 25:
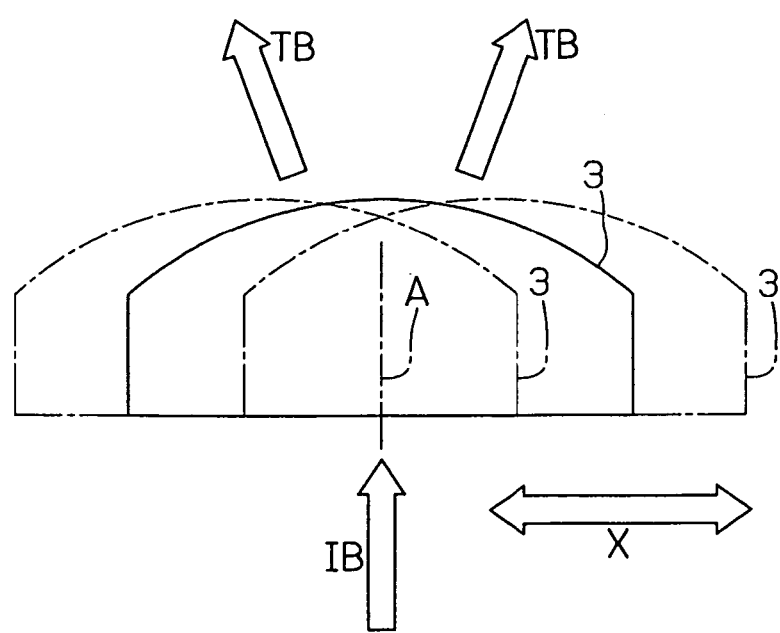
FIG. 25 is a plan view explaining an operation of the device according to the fifth embodiment.

An optical device 500 according to a fifth embodiment of the present invention is shown in FIGS. 23-25. The device 500 includes the micro lens array 3 integrated with an electrostatic actuator 531 so that the micro lens array 3 works as a scanner. Specifically, as shown in FIG. 25, the light radiated from the light source (not shown) enters into the micro lens array 3 in such a manner that the light enters out of the light axis A of the micro lens array 3, i.e., the light path of the light is out of the light axis A. Therefore, the light passes through the micro lens array 3 in a slanting direction against the light axis A. Thus, when the light enters into the micro lens array 3 apart from the light axis A, the light passes through the micro lens array 3 at a slant.

With using the above phenomenon, the micro lens array 3 is oscillated in a direction perpendicular to the light axis A, so that the light passing through the micro lens array 3 swings in relation to amplitude of the micro lens array 3. Thus, the light is oscillated (i.e., scanned) in a predetermined range of transmission angle. Therefore, the device 500 provides an optical scanner, i.e., an optical scanner integrated with the substrate 8.

Thus, the device 500 includes the actuator 531 for oscillating the micro lens array 3 in the horizontal direction (i.e., the oscillation direction) X. The actuator 531 is integrated with the micro lens array 3 in the substrate 8, and disposed around the micro lens array 3. The micro lens array 3 moves in the horizontal direction X so that the light axis A of the micro lens array 3 is shifted. Then, the light outputs from the micro lens array 3 in a various direction, i.e., the transmitted light TB is oscillated (i.e., scanned) in a certain direction.

As shown in FIG. 24, the substrate 8 is a SOI (i.e., silicon-on-insulator) substrate 508. The SOI substrate 508 includes a silicon substrate 533, an embedded oxide film 534 and a silicon thin film layer 535 as an activation layer. The micro lens array 3 is formed in the thin film layer 535, and disposed on a center portion. The actuator 531 includes a pair of movable electrodes 536a, 536b, a pair of beams 537a, 537b and a pair of fixed electrodes 538a, 538b. The micro lens array 3 is supported and connected to the beams 537a, 537b so that the micro lens array 3 is movable in the horizontal direction X. The movable electrodes 536a, 536b is integrated with the micro lens array 3, and face the fixed electrodes 538a, 538b, respectively. When a predetermined alternating electric voltage is applied between the movable electrode 536a and the fixed electrode 538a, and an inverse alternating electric voltage is applied between the movable electrode 536b and the fixed electrode 538b, the micro lens array 3 is oscillated in the oscillation direction X.

Figure 26A:
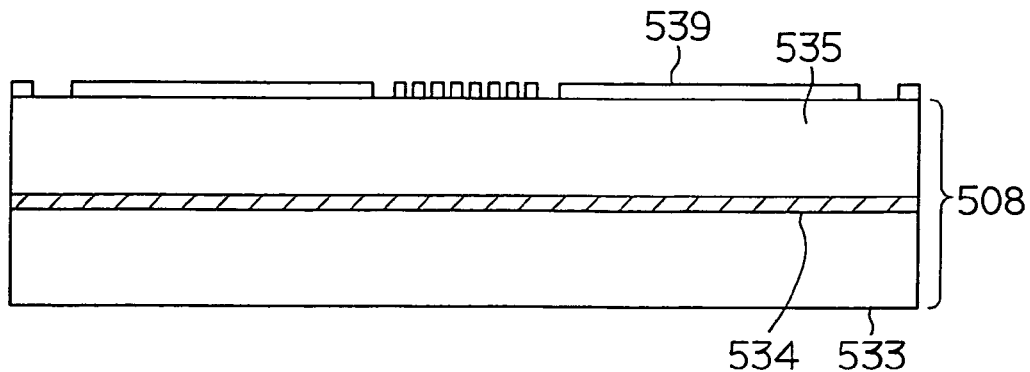
FIGS. 26A to 26C are cross-sectional views explaining a method for manufacturing the device according to the fourth embodiment.
Figure 26B:
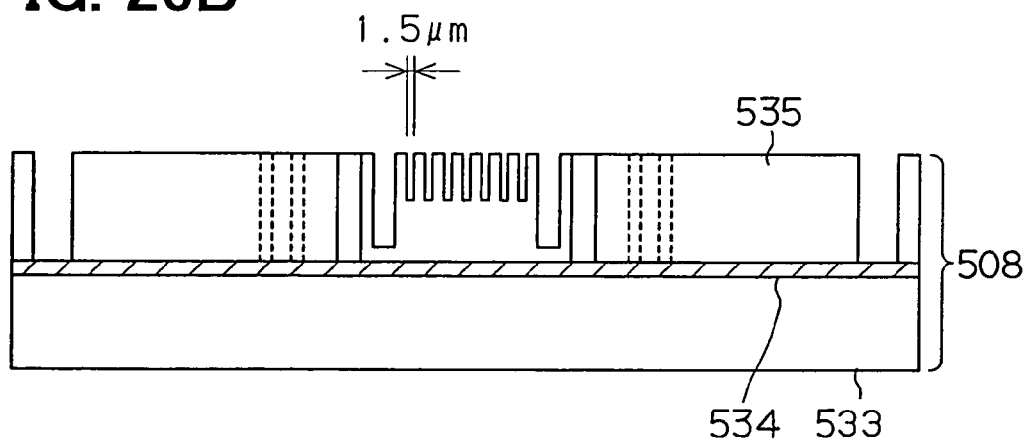

Next, the device 500 is manufactured as follows. As shown in FIG. 26A, the SOI substrate 508 is prepared. A photolithography mask 539 is formed on the thin film layer 535. The mask 539 has a predetermined pattern for providing the movable electrodes 536a, 536b and the beams 537a, 537b disposed around the micro lens array 3 through the clearance 6 and providing the fixed electrodes 538a, 538b facing the movable electrodes 536a, 536b. Then, the thin film layer 535 is etched with using the deep RIE method so that the trench 11, 15 is formed, as shown in FIG. 26B. At this time, for example, the width of the clearance 6 is 100 μm, the width of the trench 11 is 1.5 μm, the thickness of the thin film layer is 150 μm, and the height H of the micro lens array 3 is 100 μm. When the thin film layer 535 is etched so that the depth of the trench 11 reaches 100 μm, the depth of the clearance 6 may reach deeper than 150 μm because of a micro loading effect in the etching process. However, the embedded oxide film 534 prevents from being etched, so that the depth of the clearance is defined to be 150 μm.

Figure 26C:
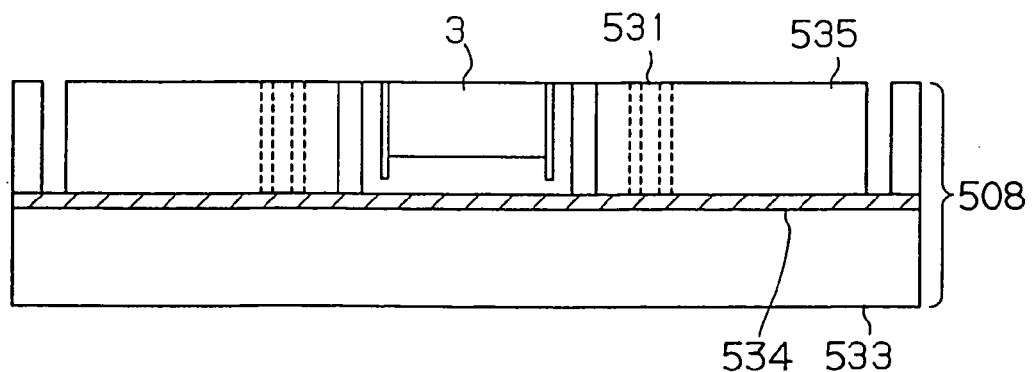

Then, as shown in FIG. 26C, the substrate 508 is thermally oxidized so that the micro lens array 3 is formed. At this time, the other portion of the substrate 508 that is different from the micro lens array 3 is also oxidized. Specifically, the surface of the other portion is oxidized. However, the thickness of the other part is sufficiently thicker than that of the silicon wall 16 so that the whole other part does not become the silicon oxide. Thus, the micro lens array 3 and the actuator 531 are formed.

Figure 27A:
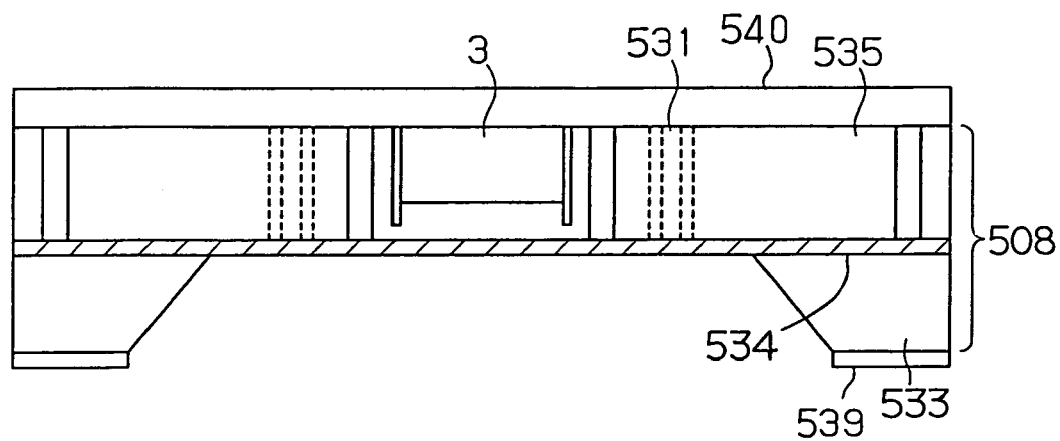
FIGS. 27A and 27B are cross-sectional views explaining the method for manufacturing the device according to the fourth embodiment.

As shown in FIG. 27A, another mask 539 is formed on a backside of the SOI substrate 508. Then, the backside of the silicon substrate 533 is etched with using the wet-etching method. After that, a photo resist 40 is coated on the thin film layer 535, and baked (annealed) so as to be hardened.

Figure 27B:
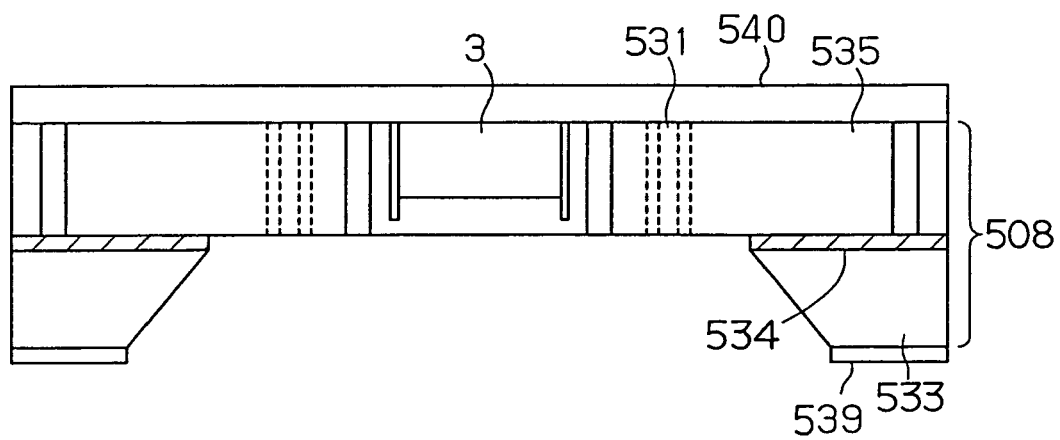

As shown in FIG. 27B, the exposed embedded oxide film 534 is etched from the backside of the SOI substrate 508 with using the dry etching method. At this time, even if an etching gas turns around the foreside of the SOI substrate 508 from a portion removed the embedded oxide film 534, the lens and the actuator 531 are covered with the resist 540 so that they are not etched by the etching gas.

Then, the mask 539 is removed, and the resist 540 is removed with using oxygen ashing method. Thus, the device 500 is completed.

Six Embodiment

Figure 28:
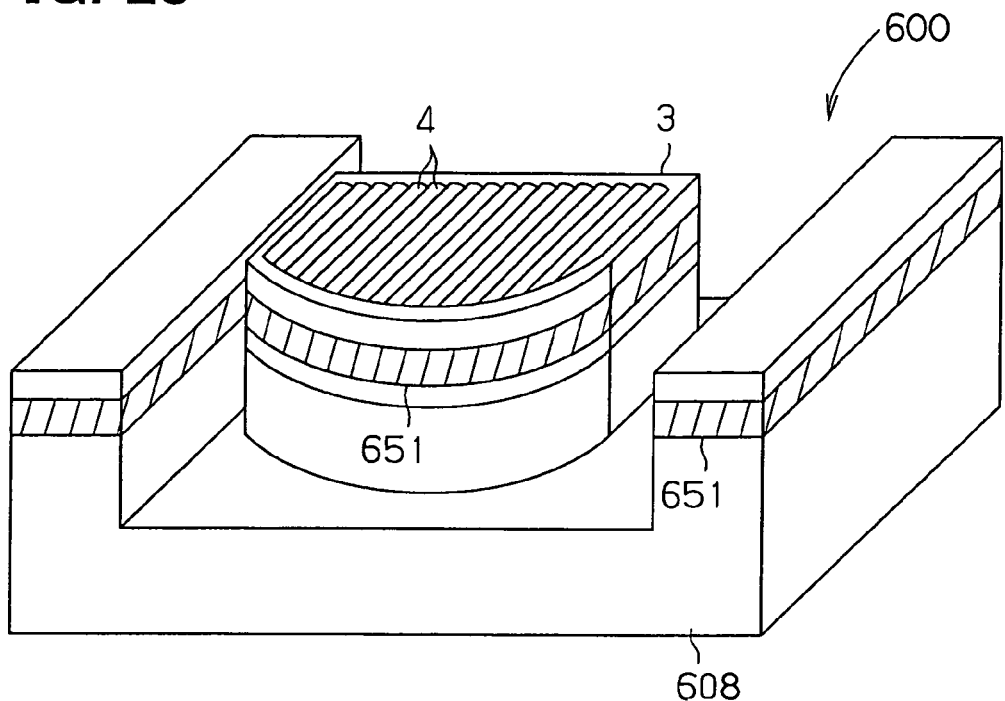
FIG. 28 is a perspective view showing an optical device according to a sixth embodiment of the present invention.

An optical device 600 according to a sixth embodiment of the present invention is shown in FIG. 28. The device 600 includes the micro lens array 3 having an impurity doped layer 651. The impurity doped layer 651 is an epitaxial layer 651, in which an impurity concentration has a certain concentration distribution in the vertical direction (i.e., a film thickness direction). Here, the impurity is, for example, germanium (i.e., Ge), phosphorous (i.e., P), tin (i.e., Sn) and boron (i.e., B). When a heavy dopant such as Ge, P or Sn is doped in a substrate 608 and then the doped substrate 608 is thermally oxidized, the doped silicon oxide has high refractive index, which is higher than that of the non-doped silicon oxide. Here, the heavy dopant is heavier than silicon. When a light dopant such as B is doped in the substrate 608 and then the doped substrate 608 is thermally oxidized, the doped silicon oxide has low refractive index, which is lower than that of the non-doped silicon oxide. Here, the light dopant is lighter than silicon.

Figures 29A, 29B:
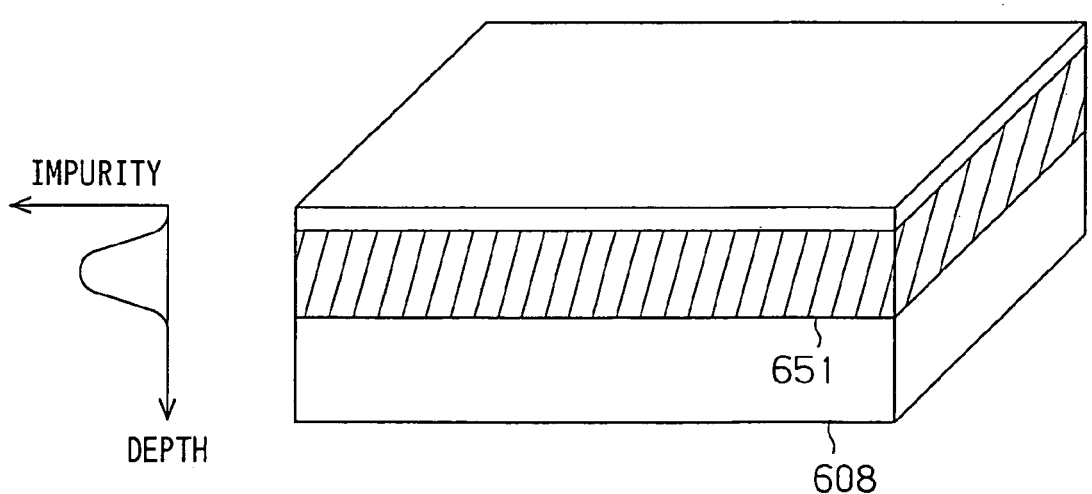
FIG. 29A is a perspective view explaining a method for manufacturing the device.
FIG. 29B is a graph showing a relationship between depth and impurity concentration in the device, according to the sixth embodiment.
Figure 30:
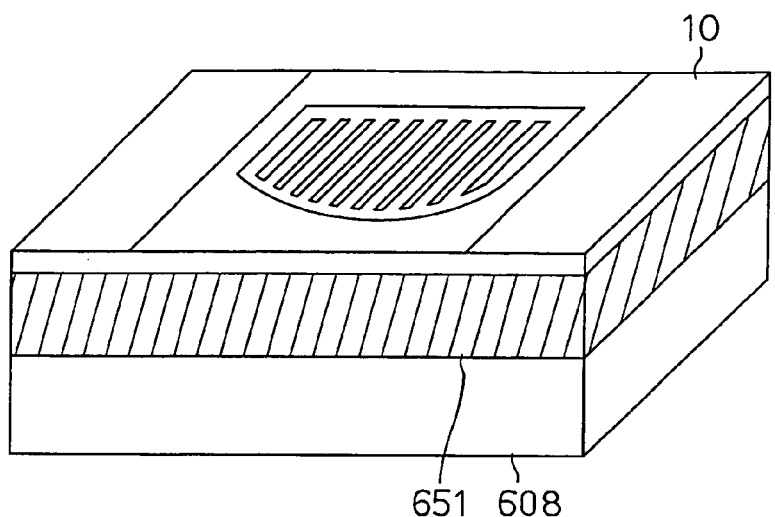
FIG. 30 is a perspective view explaining the method for manufacturing the device according to the sixth embodiment.

The device 600 is manufactured as follows. At first, for example, the epitaxial layer 651 having a various impurity concentration in the vertical direction is formed on the silicon substrate 608 with using the CVD method and the like. Here, the epitaxial layer 651 includes the impurity of Ge, and the impurity concentration in the epitaxial layer 651 is varied continuously in depth, as shown in FIG. 29A. The impurity concentration has a maximum concentration at a predetermined depth so that the concentration has a chevron shape, as shown in FIG. 29B. Specifically, the epitaxial layer 651 is deposited on the substrate 608 so as to have the predetermined impurity concentration distribution shown in FIG. 29B. Then, as shown in FIG. 30, the mask 10 is formed on the substrate 608, so that the micro lens array 3 is formed by the deep RIE and thermal oxidation processes. Specifically, the epitaxial layer 651 is formed on the substrate 608, and then the trench 11 is formed so that the silicon oxide block has the impurity concentration distribution in the vertical direction, i.e., in depth. Thus, the device 600 has the construction shown in FIG. 28. In this case, since the impurity concentration of the substrate 608 in depth, i.e., in the vertical direction Z of the micro lens array 3 has the chevron shape, the micro lens array 3 can condense the light in the vertical direction Z without additional lens. Further, the micro lens array 3 condenses the light in the horizontal direction since the lens is a cylindrical plano-convex lens.

Figures 31A, 31B:
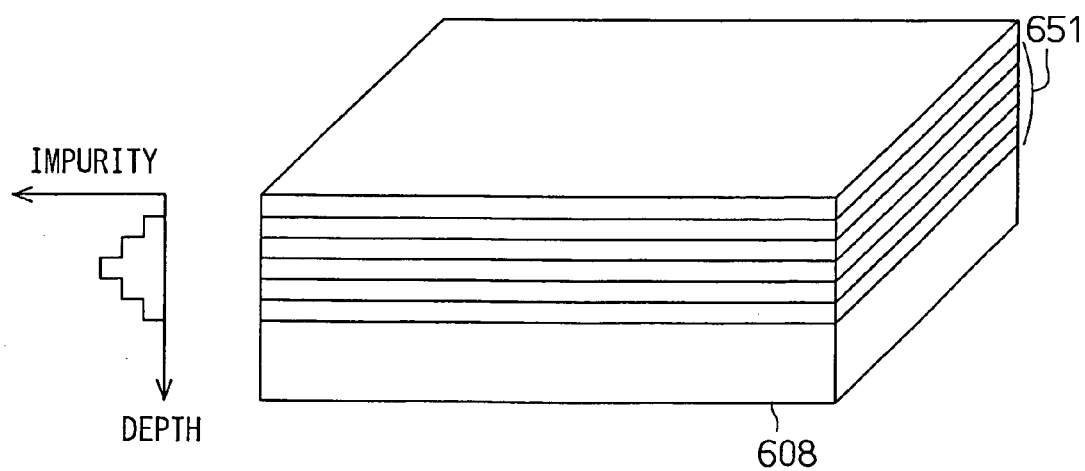
FIG. 31A is a perspective view explaining a method for manufacturing another device.
FIG. 31B is a graph showing a relationship between depth and impurity concentration in the another device, according to the sixth embodiment.

Although the impurity concentration distribution in the substrate 608 is continuous, the impurity concentration distribution can be discontinuous, as shown in FIGS. 31A and 31B. In FIG. 31B, the impurity concentration distribution in the substrate 608 has a step-like chevron shape.

Although the impurity doped layer 651 is the epitaxial layer having a various impurity concentration distribution in the vertical direction Z, the impurity doped layer 651 can be formed with using an ion implantation method or a thermal diffusion method. For example, an impurity is doped from the surface of the substrate 608 with using the ion implantation method or the thermal diffusion method. Then, the substrate 608 is annealed. However, the substrate 608 can have the impurity doped layer 651 without annealing after the impurity is doped.

Seventh Embodiment

Figure 32:
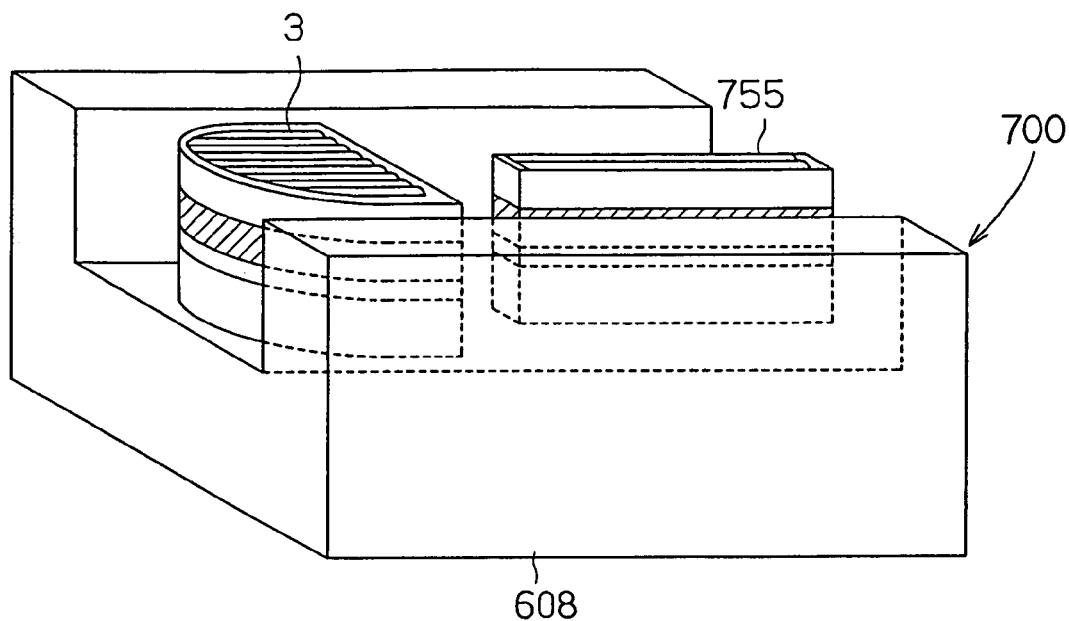
FIG. 32 is a perspective view showing an optical device according to a seventh embodiment of the present invention.
Figure 33:
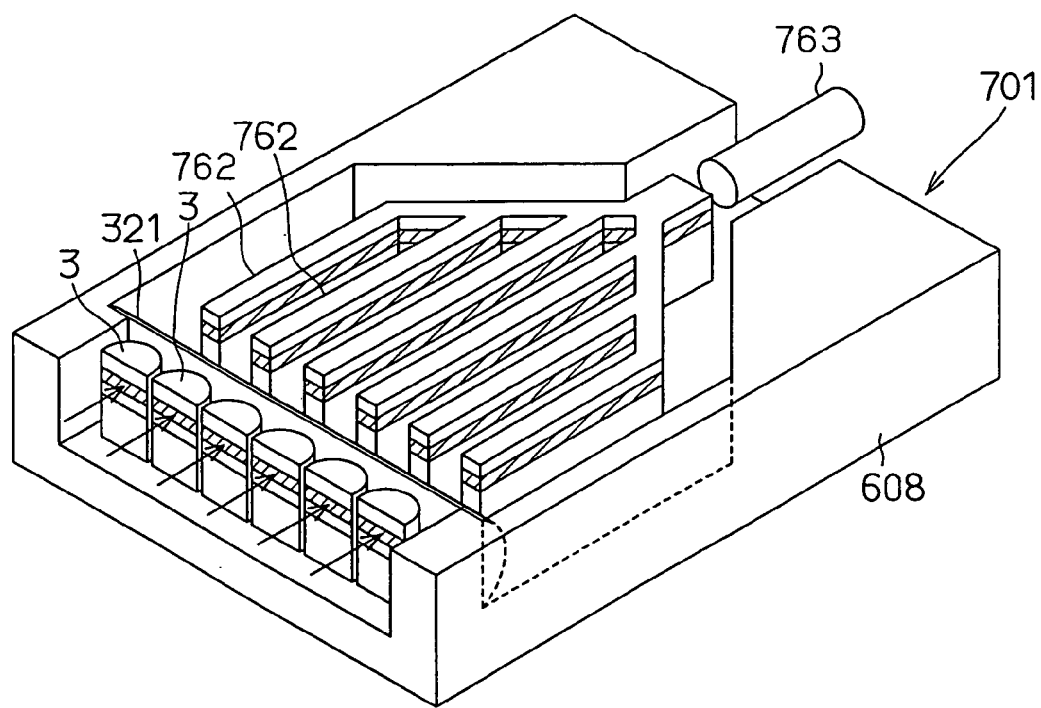
FIG. 33 is a perspective view showing another optical device according to the seventh embodiment.
Figure 34:
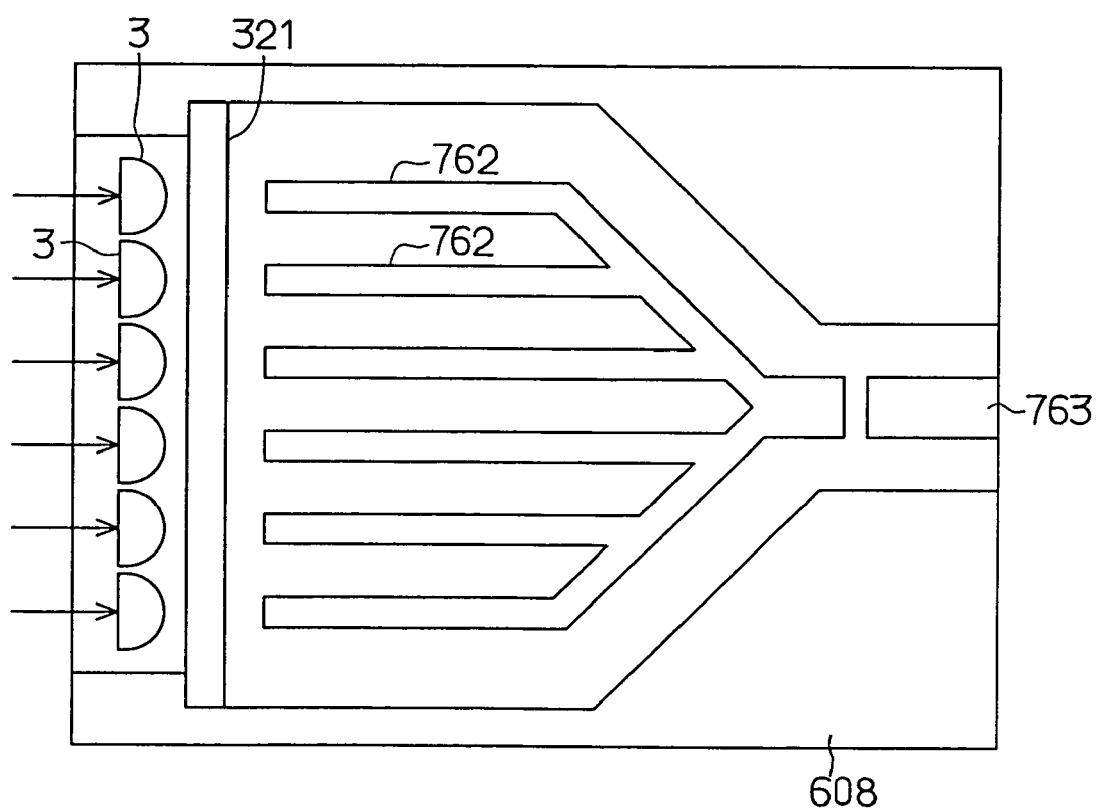
FIG. 34 is a plan view showing the another device according to the seventh embodiment.
Figure 35A:
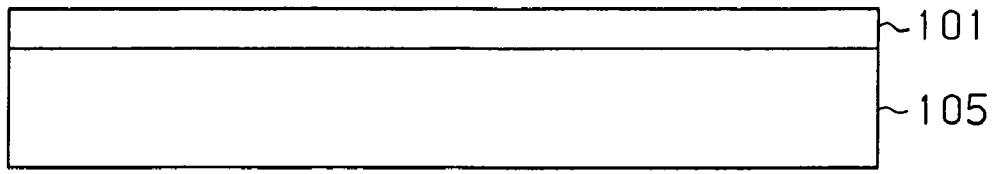
FIGS. 35A to 35D are cross-sectional views explaining a method for manufacturing an optical device according to a prior art.
Figure 35B:
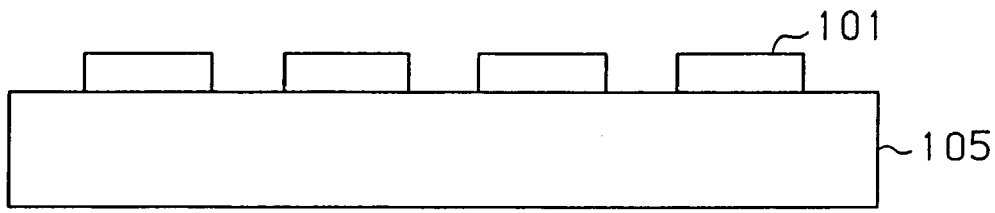
Figure 35C:
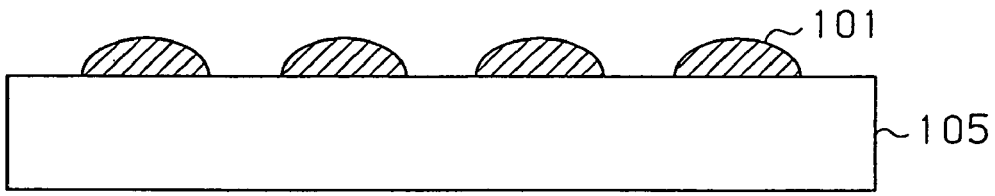
Figure 35D:
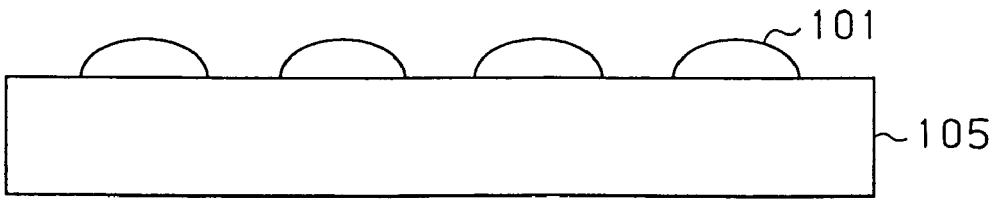

An optical device 700 according to a seventh embodiment of the present invention is shown in FIG. 32. The device 700 includes the micro lens array 3 formed from the doped substrate 608, which has the impurity concentration distribution. The device further includes a light guide 755. The light guide 755 can be formed by the same method as the micro lens array 3 is formed. Specifically, a plurality of periodic trenches is formed in the substrate 608. The number of trenches is less than that of the micro lens array 3, and the length of the trench is much longer in a longitudinal direction of the trench, so that the silicon oxide block having a line shape is formed. Thus, the light guide 755 is formed.

For example, the width of the trench is 1.5 μm, and the width of the silicon wall is 1.5 μm. The length of the silicon wall is 1 mm. The trench is sandwiched by a pair of silicon walls disposed parallel together. Then, the substrate 608 is thermally oxidized so that the light guide 755 having the width of 6 μm and the length of 1 mm is completed. In the light guide 755, the light is trapped around the center of the light guide 755. That is because the center of the light guide 755 has the maximum refractive index since the impurity concentration distribution has the maximum concentration at the center of the light guide 755 in the vertical direction Z. In the horizontal direction, the light guide 755 has a boundary between the light guide 755 and atmosphere, so that the light is trapped in the light guide 755.

Although the light guide 755 has a rectangular shape, the light guide 755 can have a different shape. Further, the light guide 755 can be formed together with the micro lens array 3, so that the light axis of the light guide 755 is aligned to that of the micro lens array 3 without positioning.

Further, another device 701 has a plurality of micro lens arrays 3, the lens 321 for condensing the light in the vertical direction, and another light guide 756. The light guide 756 faces each micro lens array 3. The light guide 756 includes a plurality of light guide parts 762. Each light guide part 762 faces the micro lens array 3, respectively. Each light guide part 762 is optically connected together so that the light guide parts 762 are focused into one light guide part. Specifically, one end of the focused light guide part is connected to a plurality of light guide parts, and the other end of the focused light guide faces an optical fiber 763. The lens 321 and the optical fiber 763 are mounted on the substrate 608. In this case, the micro lens array 3 and the light guide 762 are not required to position, so that the array 3 is aligned to the light guide without positioning. Further, it is easy to position the lens 321 and the optical fiber 763 since the lens 321 and the optical fiber 763 are aligned by an engagement into the substrate 608. Further, the device 701 has a simple construction, so that coefficient of light coupling between parts is limited from reducing. Furthermore, the device 701 can be produce in large quantities so that the manufacturing cost is reduced.

Such changes and modifications are to be understood as being within the scope of the present invention as defined by the appended claims.

What is claimed is:

1. An optical device comprising:
   a semiconductor substrate; and
   an optical part having a plurality of columnar members disposed on the substrate,
   wherein each columnar member is disposed in a standing manner and adhered each other so that the optical part is provided, and
   wherein the optical part is integrated with the substrate.

2. The device according to claim 1,
   wherein the semiconductor substrate is made of silicon, and
   wherein the optical part is made of silicon oxide.

3. The device according to claim 1,
   wherein the optical part includes a lower part, which connect to the substrate, and
   wherein the lower part has a concavity and convexity, which aligns periodically in a horizontal direction parallel to the substrate.

4. The device according to claim 1,
   wherein the optical part includes a micro lens array.

5. The device according to claim 1,
   wherein the optical part includes a light guide.

6. The device according to claim 4,
   wherein the optical part further includes a slit and a light guide.

7. The device according to claim 1,
   wherein each columnar member has a boundary disposed therebetween, and
   wherein the boundary is parallel to a light axis of the optical part.

8. The device according to claim 1, further comprising:
   a connection portion disposed between the substrate and the optical part,
   wherein the connection portion includes an upper part,
   wherein the upper part has a concavity and convexity, which aligns periodically in the horizontal direction parallel to the substrate,
   wherein the concavity and convexity of the connection portion connects to the concavity and convexity of the optical part, and
   wherein the connection portion includes a lower part, which connects to the substrate.

9. The device according to claim 1,
   wherein the substrate includes a concavity, and
   wherein the optical part is disposed in the concavity with a clearance.

10. The device according to claim 1,
    wherein the optical part has a thickness in a vertical direction, which is perpendicular to the substrate, and
    wherein the thickness is equal to or larger than 10 μm.

11. The device according to claim 1,
    wherein the columnar member includes two parts, wherein one part of the columnar member is formed by deposition, and the other part is formed by thermal oxidation.

12. The device according to claim 1,
wherein the optical part includes an impurity doped layer, and
wherein the impurity doped layer has an impurity concentration distribution in a vertical direction of the substrate.

13. The device according to claim 12,
wherein the impurity concentration distribution has a chevron shape so that a maximum impurity concentration is disposed in a predetermined depth, which is measured from a surface of the optical part.

14. The device according to claim 12,
wherein the impurity doped layer has an impurity including germanium, phosphorous, tin and boron.

15. The device according to claim 3, further comprising:
a lens disposed on the substrate,
wherein the lens is a separate part and different from the substrate, and
wherein the lens is optically connected to the micro lens array.

16. The device according to claim 15,
wherein the micro lens array condenses or collimates a light in a horizontal direction, which is parallel to the substrate, and
wherein the lens condenses or collimates the light in a vertical direction, which is perpendicular to the substrate.

17. The device according to claim 3, further comprising: an actuator disposed on the substrate,
wherein the micro lens array has a light axis, and
wherein the actuator oscillates the micro lens array in a horizontal direction so that the micro lens array scans a light in the horizontal direction, which is perpendicular to the light axis.

18. The device according to claim 17,
wherein the micro lens array is a plano-convex lens so that the light entered into the micro lens array is shifted its light path from the light axis of the micro lens array so as to output the light in a different direction.

19. The device according to claim 1,
wherein the micro lens array is a plano-convex lens, a plano-concave lens, a biconvex lens, a biconcave lens, and a meniscus lens.

* * * * *

UNITED STATES PATENT AND TRADEMARK OFFICE
CERTIFICATE OF CORRECTION

PATENT NO. : 7,532,404 B2
APPLICATION NO. : 11/528611
DATED : May 12, 2009
INVENTOR(S) : Junji Oohara et al.

Page 1 of 1

It is certified that error appears in the above-identified patent and that said Letters Patent is hereby corrected as shown below:

Title page,

Item (75), Inventors should read as follows:

Junji Oohara, Nisshin (JP);
Kazuhiko Kano, Toyoake (JP);
Yoshitaka Noda, Bisai (JP);
Yukihiro Takeuchi, Nishikamo-gun (JP);
Toshiyuki Morishita, Nagoya (JP)

Signed and Sealed this
Twelfth Day of June, 2012

David J. Kappos
*Director of the United States Patent and Trademark Office*